US006701281B2

(12) United States Patent
Satoh et al.

(10) Patent No.: US 6,701,281 B2
(45) Date of Patent: Mar. 2, 2004

(54) METHOD AND APPARATUS FOR ANALYZING BUILDING PERFORMANCE

(75) Inventors: Hiroomi Satoh, Chofu (JP); Naoki Ishido, Tokyo (JP); Hitoshi Kurioka, Chofu (JP); Hidekazu Kakei, Chofu (JP)

(73) Assignee: Kajima Corporation, Tokyo (JP)

( * ) Notice: Subject to any disclaimer, the term of this patent is extended or adjusted under 35 U.S.C. 154(b) by 0 days.

(21) Appl. No.: 09/903,748

(22) Filed: Jul. 13, 2001

(65) Prior Publication Data

US 2002/0029129 A1 Mar. 7, 2002

(51) Int. Cl.$^7$ ............................................. G06F 17/50
(52) U.S. Cl. ........................ 702/182; 702/183; 702/152; 703/1; 703/6
(58) Field of Search .................. 702/182, 183, 702/184, 150, 151, 152, 153, 57, 189; 703/1, 2, 3, 5, 6; 706/920, 923, 930; 345/6, 629, 848; 340/500, 540

(56) References Cited

U.S. PATENT DOCUMENTS

| 4,964,060 | A | * | 10/1990 | Hartsog ........................... 703/1 |
| 5,754,189 | A | * | 5/1998 | Doi et al. ..................... 345/473 |
| 5,808,916 | A | * | 9/1998 | Orr et al. ........................ 703/6 |
| 5,818,737 | A | * | 10/1998 | Orr et al. ........................ 703/6 |
| 5,983,010 | A | * | 11/1999 | Murdock et al. ............... 703/6 |
| 6,117,178 | A | * | 9/2000 | Whitney et al. ............... 703/12 |

FOREIGN PATENT DOCUMENTS

| JP | 05040887 A | * | 2/1993 | ........... G08B/17/00 |
| JP | 06162364 A | * | 6/1994 | ........... G08B/17/00 |
| JP | 08249313 A | * | 9/1996 | ........... G06F/17/00 |
| JP | 10116023 A | * | 5/1998 | ........... G09B/9/00 |

OTHER PUBLICATIONS

FiRECAM Version 1.6.1—User's Manual. 1995–2002.*
"Computer Models for Evacuation: buildingEXODUS" (no date).*
FiRECAM Version 1.6.1—User's Manual. 1995–2002.*
Computer Models for Evacuation: buildingEXODUS, summary of Rev. 3.0, May 2000.*
"Exodus Model Briefly Explained" (no date) http://fseg.gre.ac.uk/exodus/work.html.*
Kisko et al., "Evacnet4 User's Guide". Oct. 1998. http://www.ise.ufl.edu/kisko/files/evacnet/EVAC4UG.HTM.*
Friedman, "An International Survey of Computer Models for Fire and Smoke". Journal of Fire Protection Engineering, 4 (3), 1992, p. 81–82.*
CRISP Data Sheet, "Computer Models for Fire and Smoke". (no date).*

* cited by examiner

Primary Examiner—Marc S. Hoff
Assistant Examiner—Jeffrey R West
(74) Attorney, Agent, or Firm—Oblon, Spivak, McClelland, Maier & Neustadt, P.C.

(57) ABSTRACT

A building response function defining a response of a building to specific environmental change, e.g., occurrence of a fire, in terms of the building structure, is stored in a computer. Also stored is a refuge motion function defining the refuge motion of individuals in terms of attributes of the individuals and the building response. The building response is computed by substituting design values of the building structure into the response function. Attributes of persons are inputted to the computer, and individuals' refuge motion is computed by using both inputted attributes and the computed building response. With the inputted and computed values, three-dimensional (3D) simulation images of the building structure, of the building response, and of individuals' refuge motion are computed. Then, a superposed 3D simulation image of the three images is displayed to facilitate analysis of the building performance.

20 Claims, 17 Drawing Sheets

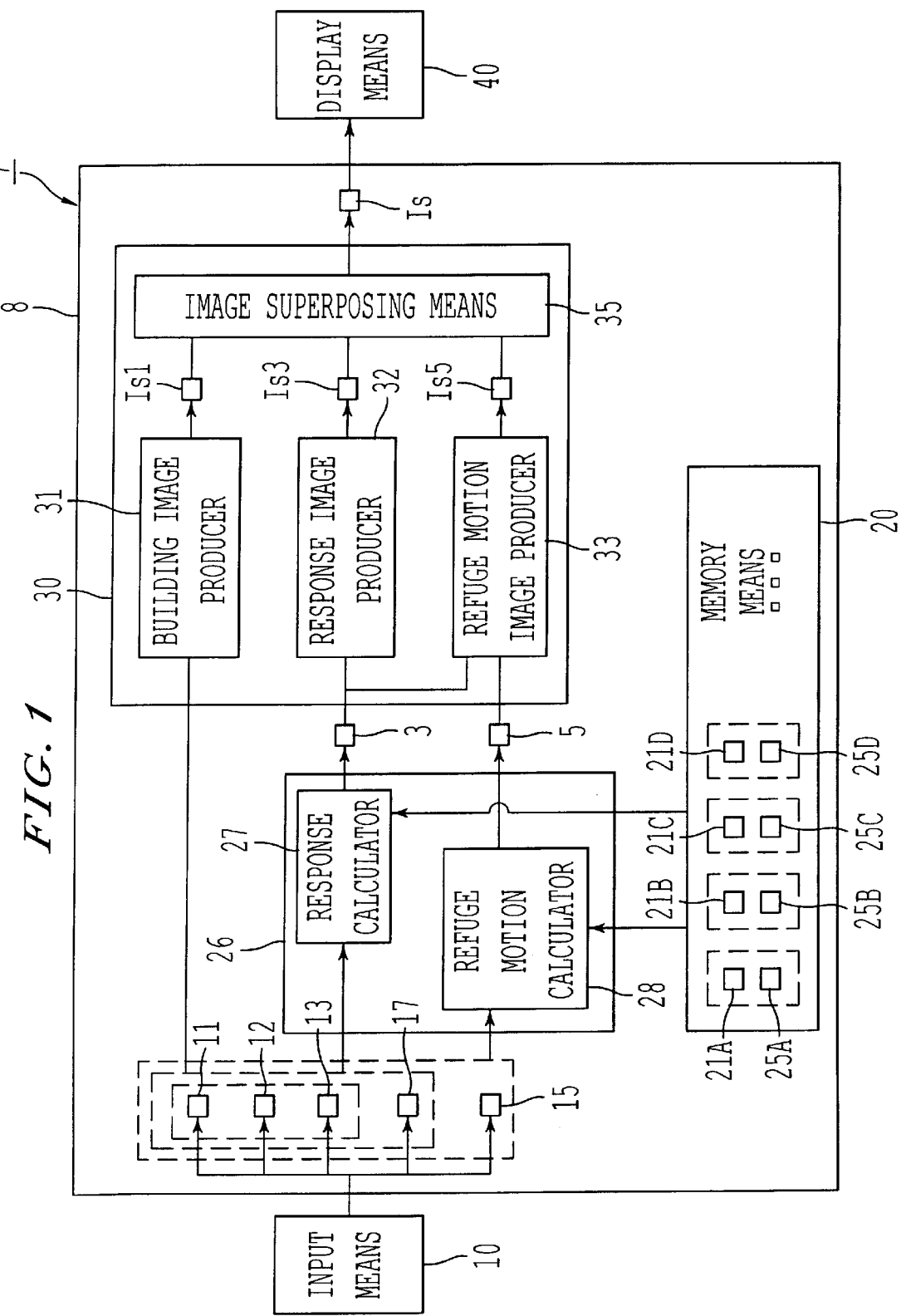

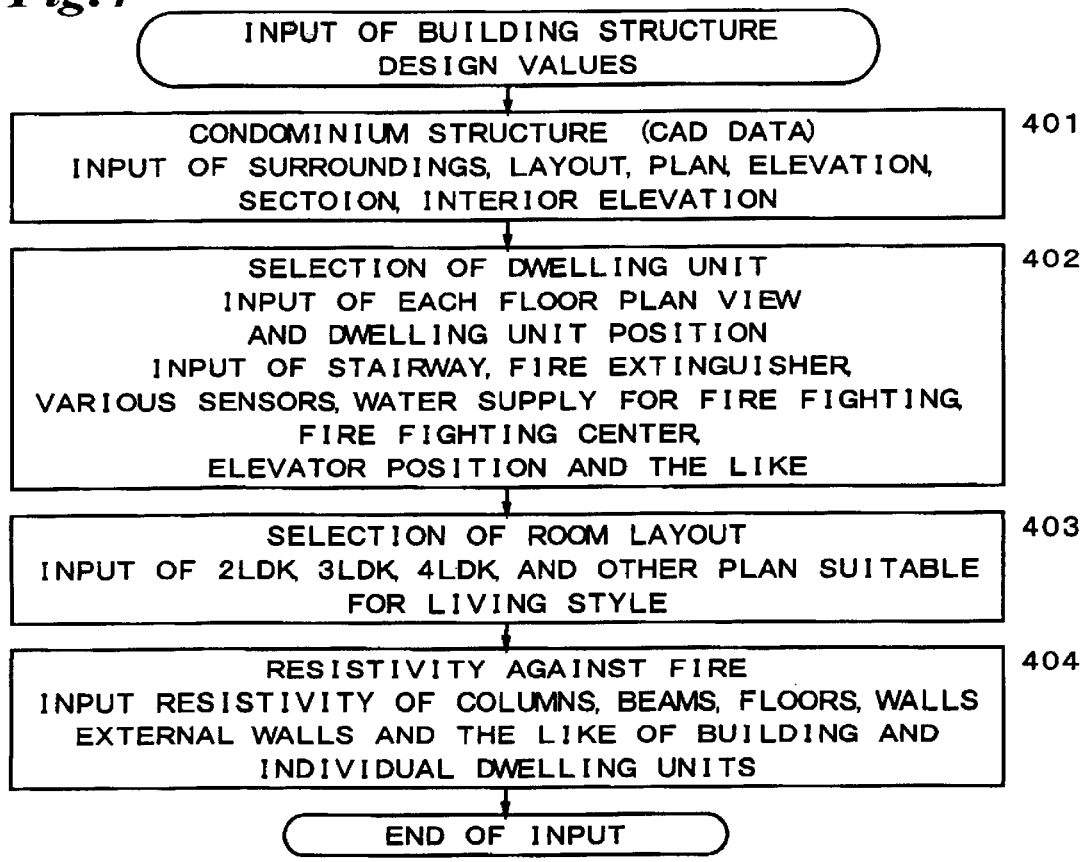
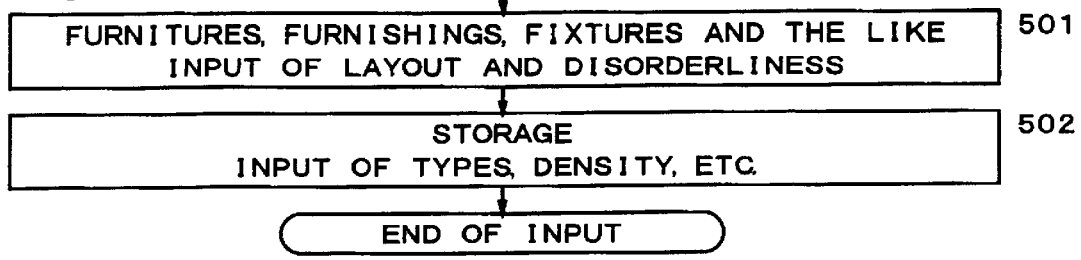

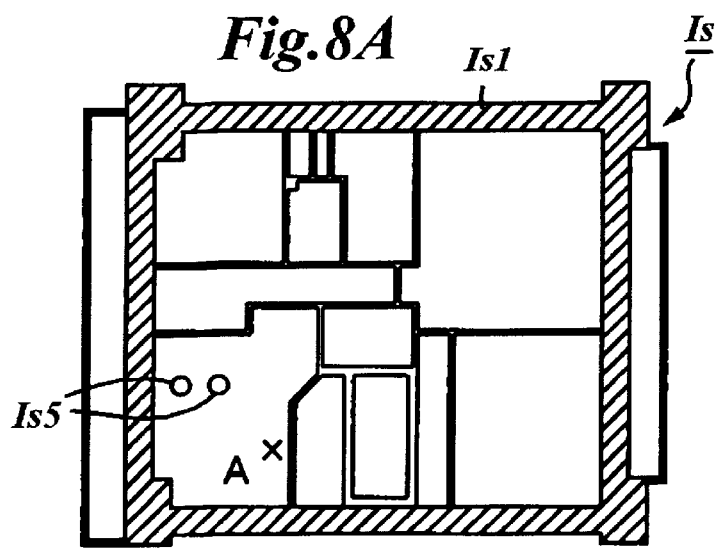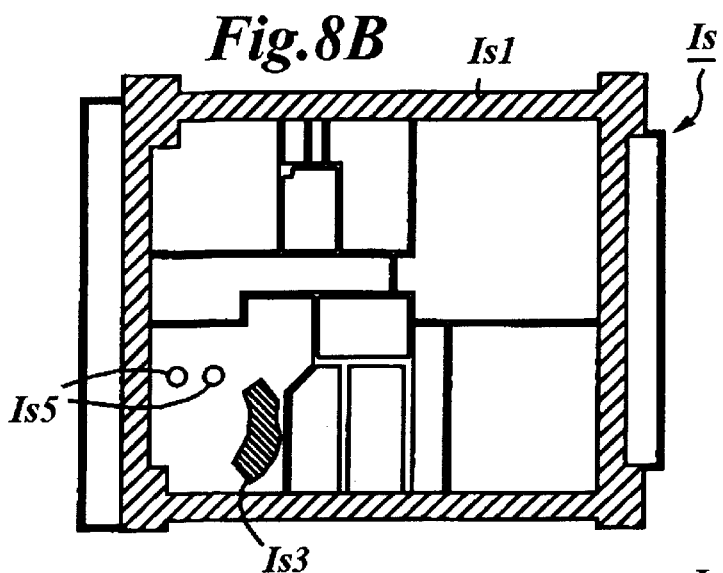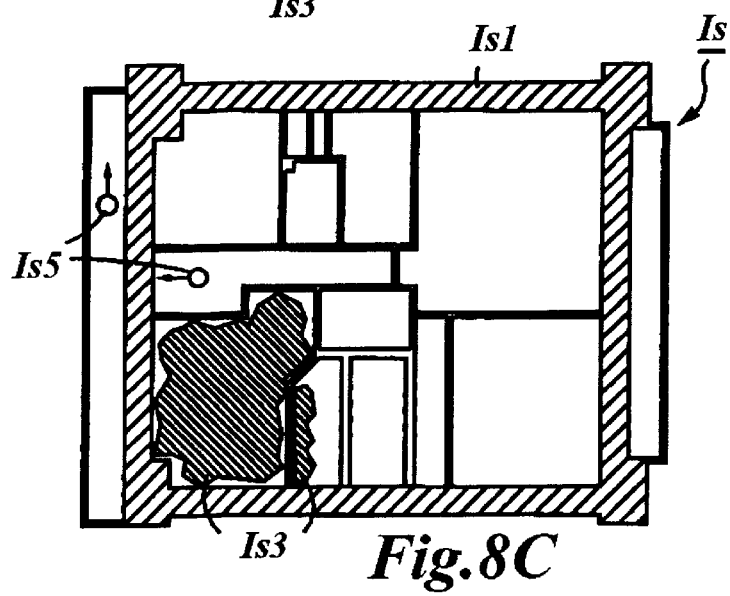

FIG. 13

FIG.16  PATTERN A
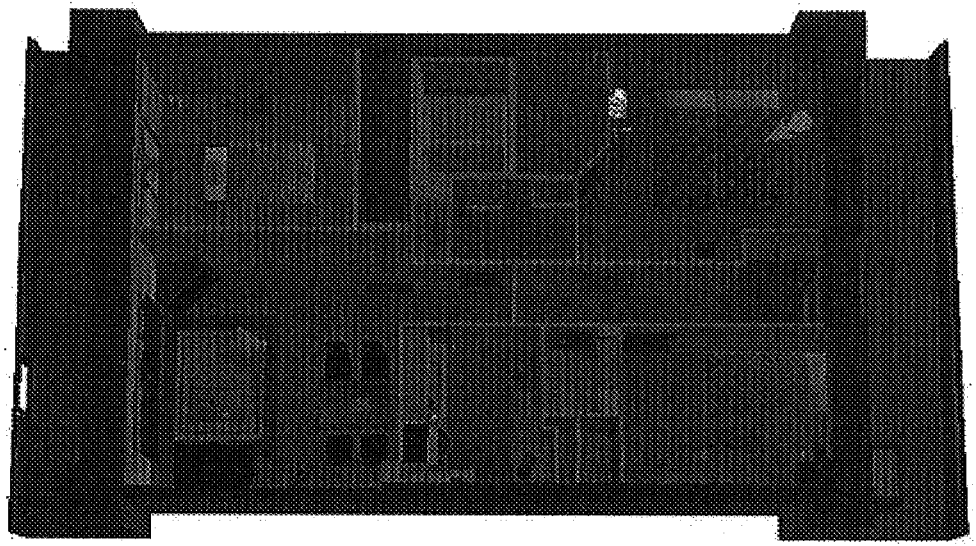
TIME FROM FIRE START    17.6sec
FIG.17  PATTERN A
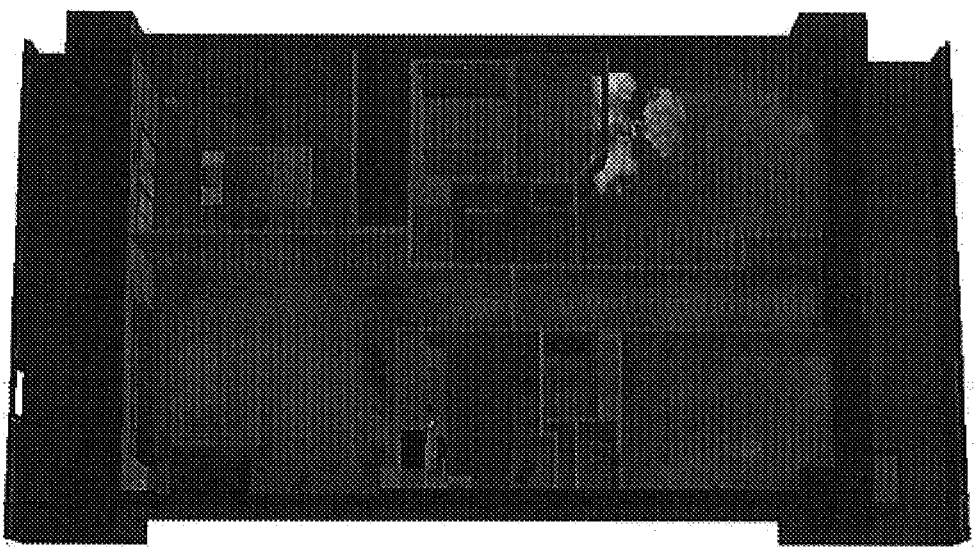
TIME FROM FIRE START    51.2sec

PATTERN A

TIME FROM FIRE START 150.5sec

PATTERN A

TIME FROM FIRE START 0.0sec

PATTERN A

TIME
FROM
FIRE
START
40.5sec

PATTERN A

TIME
FROM
FIRE
START
101.0sec

METHOD AND APPARATUS FOR ANALYZING BUILDING PERFORMANCE

BACKGROUND OF THE INVENTION

1. Field of the Invention

This invention relates to a method and an apparatus for analyzing performance of building, and in particular, relates to such method and apparatus which analyze building performance by visualizing it in three-dimensional simulation images.

2. Prior Art

Buildings are generally required to render certain level of performance in response to those changes in surrounding conditions that affect the safety and habitability. Examples of phenomena causing such changes are, for instance, fire, earthquake, strong wind, heavy rain, coldness, hotness, air pollution, noise, upstairs life noise, brightness, and the like (those phenomena causing changes in surrounding conditions will be collectively referred to as "environmental change", in the present text). Further, it is a recent trend for owners to ask designers and builders to explain performance of the building being designed or built in easily understandable terms, so that owners and expected users may objectively evaluate and compare performance of the building.

As to residential buildings (to be referred to as "residence"), a residence performance indicating system has been introduced in Japan by establishing "Law for Advancement of Residence Quality Assurance and the Like." The system facilitates objective evaluation of residence performance by ranking specific items of performance. Typical performance items subject to the ranking are as follows; structural strength (seismic resistance, wind resistance), fireproof fire-resistance (fire safety), durability (prevention and retardation of building degradation), ease of maintenance and management (easiness in maintenance, management and remodeling), adaptation to longevity (mobility, accessibility to nursing and daily safety of elders), energy saving (energy-saving efficiency in protection against winter-chill and summer-heat, air-cleaning, air conditioning and the like), lighting and ventilation (assurance of brightness), acoustic environment (soundproofing, privacy concerning living sound).

For instance, in the case of item "fire safety", the above residence performance indicating system renders ranking with respect to the durable time of building skeleton against fire, the level of fire detecting ability in terms of number of fire sensors installed, and the like. With such ranking, it becomes possible to make relative comparison of fire safety of residence itself. More specifically, if it is assumed that a fire breaks out at the living room or kitchen of a residence, the class 3 of the above ranking requires installation of such fire sensors that enable fire detection at any part of the residence. On the other hand, under the same setup, the class 2 of the ranking requires installation of only such fire sensors that enable fire detection in the vicinity of the living room or kitchen. Thus, a residence with class 3 of fire sensor installation has a higher chance of detecting a fire in the house by detecting it earlier than a residence with class 2 of fire sensor installation.

However, it is sometimes difficult to evaluate the level of fire safety of residence based solely on the length of durable time against fire and ranking of fire sensor installation. In case of an actual fire, other factors, e.g., structural arrangement of rooms and fire resistance of building materials, will also affect residence performances. For instance, such other factors may affect fire expansion (inclusive of temperature rise, flame length increase, expansion of flaming area), and smoke spread (inclusive of how smoke descends from ceiling and accumulates in rooms, and how temperatures of smoke layers increase). Further, difference in arrangement and density of furniture may also result in different residence performances. To facilitate evaluation of fire safety of building, there is a demand for development of a system that enables evaluation of fire expansion and smoke spread based on the structure and equipment of building, as well as arrangement of furniture therein. Besides the fire safety, there is a need for system to evaluate building resistance against environmental changes such as earthquakes and strong winds.

BRIEF SUMMARY OF THE INVENTION

Therefore, it is an object of the invention to provide a method and an apparatus for visual learning of refuge motion from a building responsive to an environmental change both in its structure and in refuge motion of individual persons therein.

The applicants noted three-dimensional (3D) simulation technique that is often used in the field of architecture, urbanization planning, and geographical information system (GIS). The 3D simulation builds such a virtual 3D space within a computer system that corresponds to an actual 3D space in the real world, and it enables analysis of the actual 3D space through observation of the corresponding virtual 3D space. The 3D simulation can be effected, for instance, by using the art of virtual reality (VR) or computer graphics (CG). With VR, one can carry out various active test operations in the virtual space and can obtain feeling of virtual reality on real time basis. Real time feeling is not available in CG. If one can visualize the response of a building to environmental change by means of images used in the 3D simulation, such visualization will facilitate analysis of building performance.

Referring to FIG. 1 illustrating a block diagram of an embodiment of the invention and FIG. 2 showing a flowchart of the present method, the method for analyzing building performance according to the invention will be summarized. Two functions are stored in a computer 8; namely, a building response function 21A (21B, 21C, and 21D being equivalent elements) and a refuge motion function 25A (25B, 25C, and 25D being equivalent elements). The first function 21A defines response 3 of a building and inside thereof to a specific environmental change in terms of the structure of the building. The second function 25A defines refuge motion 5 of individual persons in the building in terms of both the attributes 15 of the individual persons and said response 3 of the building. The computer 8 computes the response 3, inclusive of the building itself and the inside thereof, by substituting design values 11 of the structure of the building into the building response function 21A. The computer 8 also computes refuge motion 5 of individual persons by substituting both the attributes 15 and the computed value of the response 3 into the refuge motion function 25A. Based on the inputted design values 11 of the building and computed values of the response 3 and the refuge motion 5, three three-dimensional (3D) simulation images are computed, namely, a 3D simulation image Is1 of the building structure, a 3D simulation image Is3 of the response 3, and a 3D simulation image IsS of the individual persons' refuge motion 5. Then, a superposed display Is of the above three 3D images is computed and displayed, so as to facilitate visual analysis of said building response 3 and the refuge motion 5 of the individual persons for the specific environmental change.

Preferably, in addition to the above structure design values 11, equipment design values 12 are used as a second variable in the response function 21A. Thereby, the response 3 of the building to an environmental change is determined from two viewpoints, namely from the structure design values 11 and from the equipment design values 12, by substituting the design values 11 and 12 in the response function 21A. More preferably, a third viewpoint of indoor goods (such as furniture) disposed in the building may be included in determining the response 3 of the building. More particularly, the response function 21A for determining the response 3 of the building may have three variables; namely, structure design values 11, equipment design values 12, and attributes 13 of indoor goods.

Again referring to FIGS. 1 and 2, an apparatus for analyzing building performance according to the present invention comprises a memory 20 storing a building response function 21A that defines building response 3 of the building and the inside thereof to a specific environmental change in terms of the structure of the building, and a refuge motion function 25A that defines refuge motion 5 of individual persons in the building in terms of both attributes 15 of the individual persons and said building response 3 of the building; an input means 10 for entering design values 11 of the structure of the building and attributes 15 of the individual persons; an operating means 26 for computing the building response 3 by substituting design values 11 of the structure of the building into the building response function 21A, and the refuge motion 5 of the individual persons by substituting the attributes 15 and the computed building response 3 into the refuge motion function; an image-producing means 30 to produce a superposed display Is of a three-dimensional simulation image Is1 of the building according to the design values, and a three-dimensional simulation image Is3 of the building response thus computed, and a three-dimensional simulation image Is5 of the refuge motion of the individual persons thus computed; and a display 40 to show the superposed display Is, so as to enable visual analysis of said building response and the refuge motion of the individual persons in response to the specific environmental change.

Preferably, the function 21A is stored as a function of the building structure and equipment installed on the building, and the input device 10 enters the structure design values 11 and the equipment design values 12, and the calculating unit 26 calculates the response 3 of the building to the specific environmental change by substituting both the structure design values 11 and equipment design values 12 into the function 21A. More preferably, the response function 21A is stored as a function of the building structure and indoor goods disposed in the building, and the input device enters the building structure design values 11 and equipment design values 12 and attribute values 13 of indoor goods, and the calculating unit 26 calculates the response 3 of the building to the specific environmental change by substituting the building structure design values 11, equipment design values 12, and attribute values 13 of indoor goods in the response function 21A.

BRIEF DESCRIPTION OF THE SEVERAL VIEWS OF THE DRAWINGS

The foregoing and other objects, features, and attendant advantages of the present invention will be appreciated in accordance with the following description and accompanying drawings wherein;

FIG. 1 is a block diagram of an embodiment of an apparatus according to the present invention, FIG. 4 is a flowchart for input process of design values of building structure, FIG. 5 is a flowchart for input process of attribute values of indoor goods, FIGS. 8A, 8B and 8C show three superposed simulation images illustrating refuge motion of persons at different moments after fire break out, FIG. 13 is an input dialogue panel for selecting design values of equipment installed in the building, FIG. 16, FIG. 17 and FIG. 18 are black and white photographs depicting superposed simulation images of dynamic smoke spread, said images of the three figures being simulated for the moment 17.6 seconds, 51.2 seconds and 150.5 seconds after fire occurrence, respectively.

DETAILED DESCRIPTION OF THE INVENTION

Description of the Preferred Embodiments

Figure 2A:
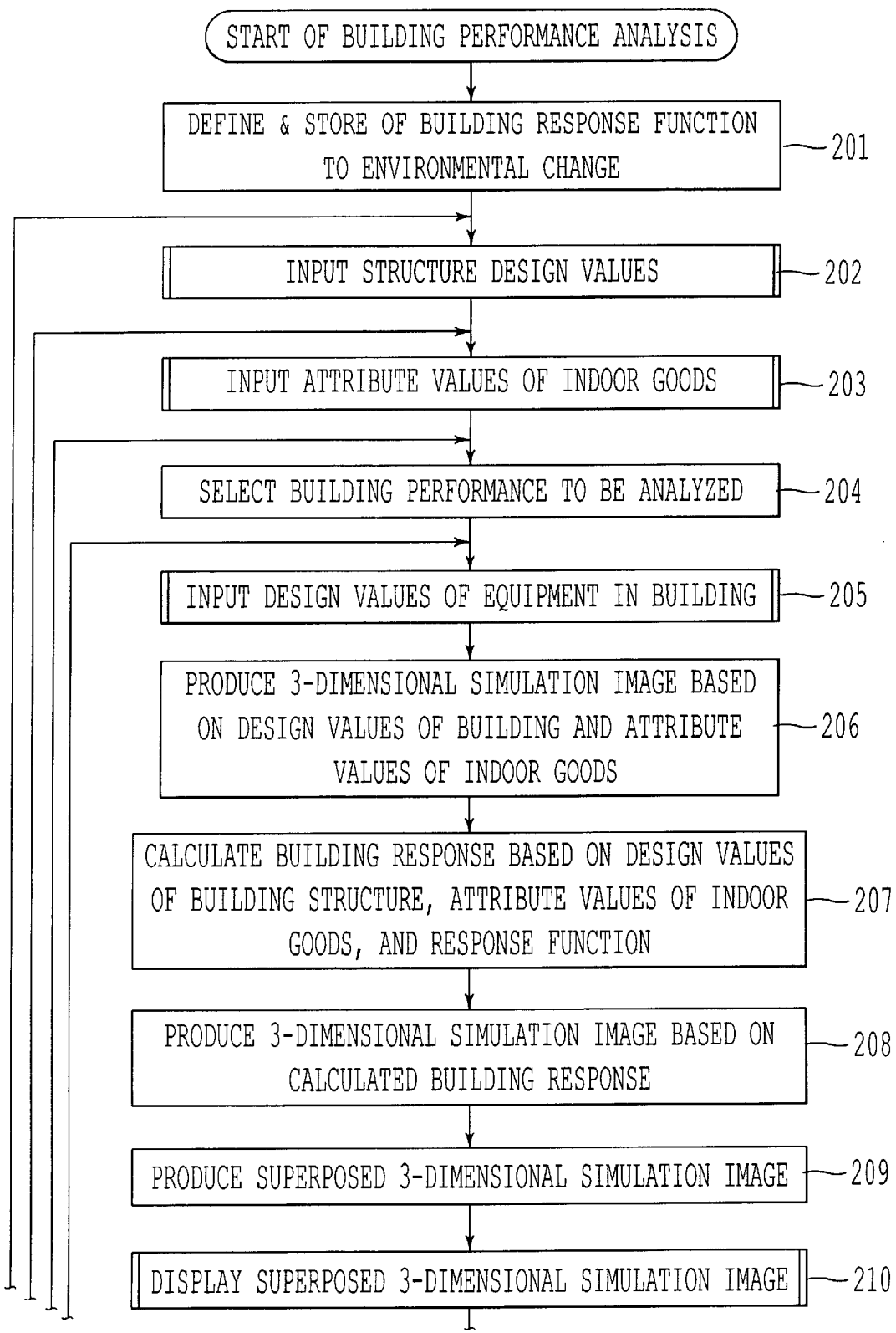
FIG. 2 is a flowchart showing the process of analyzing building performance in the method of the present invention.

FIG. 1 shows a block diagram of a performance analysis system 7 according to the present invention. The system comprises a computer 8, an input means 10, which includes joystick means, a memory means 20, and a display means 40. The memory means 20 stores response functions 21A–21D of a building and/or equipment therein to an environmental change. The response functions 21A–21D depend on variables including at least building structures and time, and generate a calculated response of the building to the environmental change with time. In the illustrated embodiment, the memory means 20 stores a plurality of response functions 21A, 21B, 21C, and 21D for different environmental changes, such as fire, earthquake, strong wind, and the like. In practical applications, one or more response functions 21A–21D are used depending on the range of analysis to be made. When a plurality of response functions 21A–21D are used, corresponding selection values 17 are assigned to different response functions 21A–21D, respectively, and each response function 21A–21D is stored together with the selection value 17 assigned thereto. One of the response functions 21A–21D is selected at one time, by entering the corresponding selection value 17 into the input means 10.

Figure 2B:
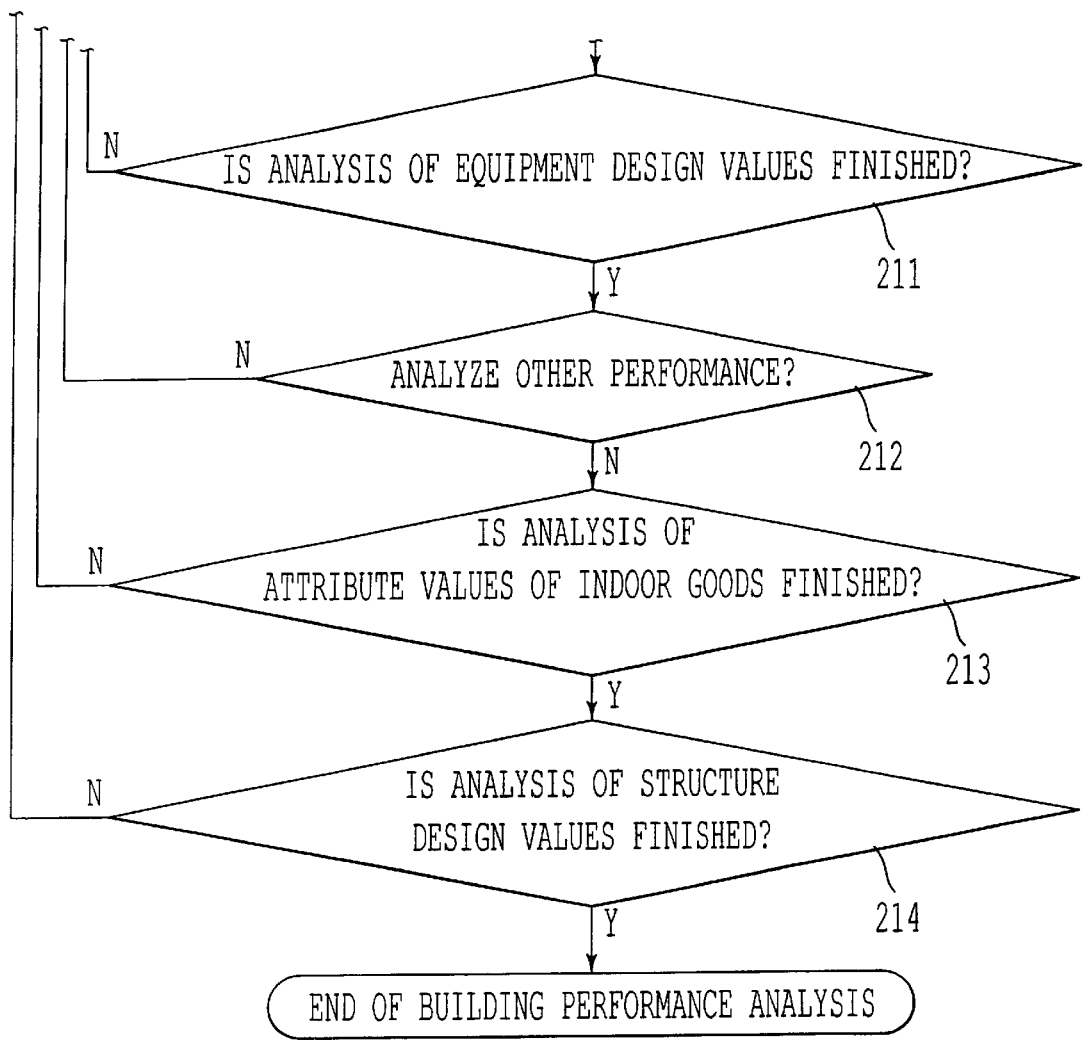

FIG. 2 shows a flowchart showing the operation of performance analysis by using the performance analysis system 7 in FIG. 1. For simplicity of explanation, the environmental change is at first assumed to be an occurrence of fire, and the building response to be analyzed is assumed to cover the fire expansion with time and dynamic smoke spread with time, so that fire safety performance of a building is analyzed in the beginning. However, it should be noted, of course, that the building performance to be dealt with by the invention is not restricted to fire safety performance alone.

In FIG. 2, a response function 21A is first generated and stored in the storage device 20 in step 201. Flame and/or smoke spreads depending upon the structure of a building, such as the arrangement of rooms, thickness of walls, presence of windows and/or openings, fire endurance of floors and/or walls, and/or fireproof performance of interior finishing materials. Therefore, a response function 21A for fire has variables including arrangement of rooms, walls, windows and/or openings, floors, interior finishing materials, and the like.

Further, the fire flame expansion and dynamic smoke spread in fire depend upon not only the above-mentioned structure of the building in fire, but also equipment installed in the building, such as presence and/or type of a sensor, presence and/or type of smoke extraction facility, presence and/or type of fire extinguish facility, and/or maintenance management of each facility. If the analysis of the fire safety performance of a building includes that of the equipment in the building, the response function 21A for fire should preferably have variables dealing with a sensor, a smoke extraction facility, a fire extinguish facility, design of facilities for management, level of maintenance, and the like.

Furthermore, the flame expansion and dynamic smoke spread in fire depend on, besides the building structure, the type and properties of indoor goods disposed in the building, such as various kinds of furniture, furnishings, storage spaces, fixtures, combustibility and fire-resistance of the indoor goods, layout plan of such goods, their disorderliness in the manner of use, and the like. Therefore, when fire safety performance is analyzed for the indoor goods in the building, it is preferable that a response function 21A includes variables for, in addition to the above-mentioned structure and equipment, indoor goods and their characteristics and the manner in which they are used, covering even the disorderliness (for instance disorderliness in the manner of using a desk) if so desired.

An example of the response function 21A calculates, at first, the amount of heat generated per unit time (to be referred to as "heat generation" when not confusing) $\Delta Q$ due to combustion that depends upon structure, facility and/or interior equipment of the building. Then, the calculation proceeds to flame expansion (or fire expansion) $\Delta L$ based on the calculated value of the heat generation $\Delta Q$. Thereafter, it calculates the amount of smoke accumulated inside the building (or smoke descending rate from ceiling) $\Delta V$, and the building inside temperature rise (or temperature rise of smoke layer that causes fire spreading) $\Delta T$ that depends on the heat generation $\Delta Q$. In the initial stage of fire, the area of fire expands and grows, so that the flame extension $\Delta L$ and smoke accumulation $\Delta V$ are critical in fire safety, from the view point of preventing rapid fire expansion and ensuring refuge (or evacuation) route. On the other hand, in the violent state of fire, the temperature rise $\Delta T$ is critical in fire safety, from the view point of preventing the building from rapid collapsing and preventing the fire from spreading to upper floors The heat generation $\Delta Q$ in case of building fire can be simulated by a product of square of time t after fire outbreak and proportional coefficients ($\alpha$). The coefficients depend on various properties of the building; namely, inside surface area (and/or floor plan) of the building, fire resistance of walls and floors, fireproofing characteristic of interior finishing materials, presence (or absence) and type of fire extinguishing facility, arrangement of indoor goods such as a bed (more specifically the amount, surface area, and type of combustibles constituting the indoor goods), degree of disorderliness of goods layout (exposing large surface areas to air, disposing combustibles closely for easy fire expansion), and the like. Therefore, the formula of heat generation $\Delta Q$ has a variety of coefficients as shown in the equation (1); namely, a structure coefficient $\alpha 1$ depending on building structure, a equipment coefficient $\alpha 2$ depending on the number and types of equipment in the building, indoor goods coefficient $\alpha 3$ depending on attributes of indoor goods and time. Further, the equation (1) includes a miscellaneous coefficient $\alpha 4$ depending on factors not listed above.

The flame expansion $\Delta L$ in fire can be simulated by a product of a dimensionless heat generation $\Delta Q^*$ for each moment of calculation, a fire surface area D (an area), and a coefficient $\beta$, as in the equation (2). The dimensionless heat generation $\Delta Q^*$ is given by the equation (3) as a function of the heat generation $\Delta Q$ of the equation (1), a fire surface area D, and a constant K ($\approx 1116$). The fire surface area D is a function of the building inside area and the time of calculation, and nth power of D is in the equation (3), n being a constant ($=\frac{2}{3}$ or $\frac{2}{5}$) depending on the shape of fire source. From the equations (1) through (3), the flame extension $\Delta L$ is given by a function of the building structure, facility, and attributes of indoor goods.

As shown by the equation (4), the smoke accumulation $\Delta V$ is given as a difference between the smoke increment $\Delta Vs$ and a smoke decrement $\Delta Ve$. The smoke increment $\Delta Vs$ is an increment of smoke per unit time in an upward air flow produced by the heat generation $\Delta Q$ which increment is absorbed by the upward air flow through smoke whirling together with the surrounding air before the air flow enters into a hot layer at higher location. The smoke decrement $\Delta Ve$ is caused by extraction toward outside through windows and the like openings as well as by smoke exhausting equipment. More specifically, the smoke increment $\Delta Vs$ is a function of the heat generation $\Delta Q$, i.e., a function of variables representing building structures, equipment installed, and attributes of indoor goods, while the smoke decrement $\Delta Ve$ is a function of the structure of windows and the like as well as smoke exhausting equipment. Hence, the smoke accumulation $\Delta V$ can also given as a function of variables representing buildings structures and equipment and attributes of indoor goods.

Further, the equation (5) shows that the building inside temperature rise $\Delta T$ in the fire growth period of a fire is given by the difference of the heat generation $\Delta Q$ (equation (1)) and heat loss $\Delta Q_S$. As shown in the equation (6), the heat loss $\Delta Q_S$ includes ventilation heat loss $\Delta Q_L$ through an opening such as a window and a smoke exhausting equipment, the wall heat loss $\Delta Q_W$ through peripheral walls depending on the thickness and thermal properties thereof, and the radiation heat loss $\Delta Q_R$ through various openings. Therefore, the heat loss $\Delta Q$ can be dealt with as a function of variables representing the building structures and equipment installed therein. Hence, the temperature rise ΔT can be also treated as a function of the building structure, the equipment installed therein and the attributes of indoor goods disposed therein.

$$\Delta Q = \alpha \cdot t^2 = \alpha 1 \cdot \alpha 2 \cdot \alpha 3 \cdot \alpha 4 \cdot t^2 \quad (1)$$

$$\Delta L = \beta \cdot (\Delta Q^*)^n \cdot D \quad (2)$$

$$\text{where } \Delta Q^* = \Delta Q/(KD^{2/3}) \quad (3)$$

$$\Delta V = \Delta V_S - \Delta V_e \quad (4)$$

$$\Delta T = (\Delta Q - \Delta Q_S)/C \quad (5)$$

$$\text{where } \Delta Q_S = \Delta Q_L + \Delta Q_W + \Delta Q_R \quad (6)$$

As will be described later, when the refuge motion of persons is considered, conditions of fire may vary depending on their actions such as opening and closing of doors, fire extinguishing operations and the like. When fire safety performance is analyzed considering fire refuge motion of persons, the response function 21A for fire may include motion of persons.

With actual buildings and indoor space therein, occurrence of a fire is a phenomenon of probability, and when a fire breaks out the building can be at any of a wide variety of conditions, in terms of building structures, conditions of equipment, use of spaces, and the like. Therefore, before defining the response function 21A and its variables, it is preferable to collect statistical data obtained by surveys on building conditions at actual fire break out; such as conditions of building structures and equipment therein and layout of combustible furniture and other indoor goods at the time of fire occurrence. With such statistical data, one may reach to a reasonable balance among contributions from building structures, equipment, and indoor goods to the fire expansion and smoke spread.

Furthermore, the fire expansion and smoke spread at the time of a fire vary depending on its cause. For instance, characteristics of flames can be identified for different causes of fire, such as electricity-related (electric appliances), gas-related (gas appliances such as stove, bath boiler), cooking-related (range for TEMUPURA), cigarette-related and so on. Thus, it is possible to analyze the fire safety performances of a building for different causes of fire, by defining response functions 21A for different fire causes, respectively. Preferably, the response function 21A is defined for each of different fire causes and each of different ignition goods, so as to facilitate analysis of fire expansion and smoke spread for any combination of the fire cause and the ignition good.

When response functions 21A are defined, the input device 10 applies design values 11 of building structure into the computer 8, as shown in step 202 of FIG. 2. Assuming that the building is a condominium and the fire safety performance of each dwelling unit is analyzed, FIG. 4 shows a method for preparing the input of building structure design values 11. In step 401 of FIG. 4, data on the condominium structure are entered, which data include a view of periphery, a view of layout, a plan view, a vertical view, an interior elevation and so on. In step 402, data on the selection of dwelling unit of condominium are entered, which data include floor plans for individual floors and positions of individual dwelling units. In step 403, data on the room layouts of individual dwelling units are entered. Design drawings made by computer aided design (CAD) and the like may be used as design values 11 of condominium structures, structures of individual floors, the structure of individual dwelling units. In step 404, fire resistance of columns, beams, floors, walls, external walls and the like of condominium building and individual dwelling units is entered.

In step 403 of FIG. 4, the design values 11 of a dwelling unit floor layout are entered by selecting them from a plurality of preset patterns. Thereby, it becomes possible to select and change the room layout design values 11. For instance, in a condominium where dwelling unit room layout (plan design) can be freely designed, a purchaser can compare the fire safety performance of different room layouts while freely selecting sample room layouts. Further, in step 402, the structure design values 11 for common use areas, such as stairs, fire extinguishers, various sensors, water supply for fire fighting, fire fighting centers, elevators, and the like can be also entered by selecting them from a plurality of preset patterns. Thereby, it becomes possible to evaluate the fire safety performance of each dwelling unit while considering design values 11 of common use area.

Figure 10:
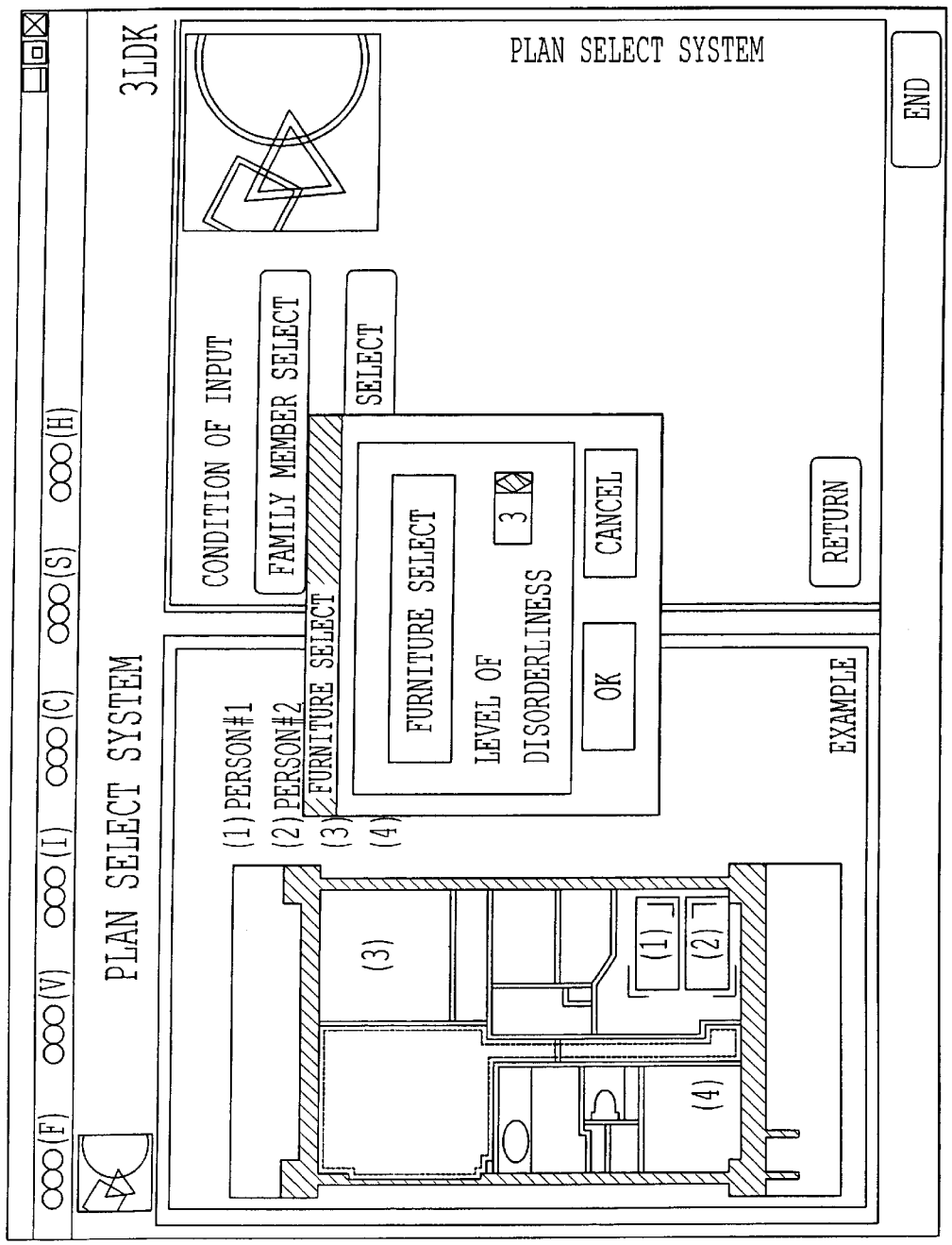
FIG. 10 is an input dialogue panel for selecting the degree of disorderliness of indoor goods.

Returning to FIG. 2, the input device 10 enters attribute values 13 of indoor goods in the step 203. FIG. 5 shows an example of the method for entering attribute values 13 of indoor goods. In step 501, arrangement of furniture, furnishings, and fixtures, and disorderliness of the inside of drawers, and the like are entered. Step 502 enters the kind and density of storage. For instance, a plan view of each dwelling unit floor layout is shown on the display means 40 based on the design values 11, which are entered in the preceding step 201. The arrangement of furniture and/or storage is specified on the plan view in the display means 40, so that entering of the attribute values 13 is made easier. The disorderliness of the indoor goods is entered, for instance, by specifying a level of disorderliness. FIG. 10 illustrates an example of input panel for entering the level of disorderliness of indoor goods.

Figure 14:
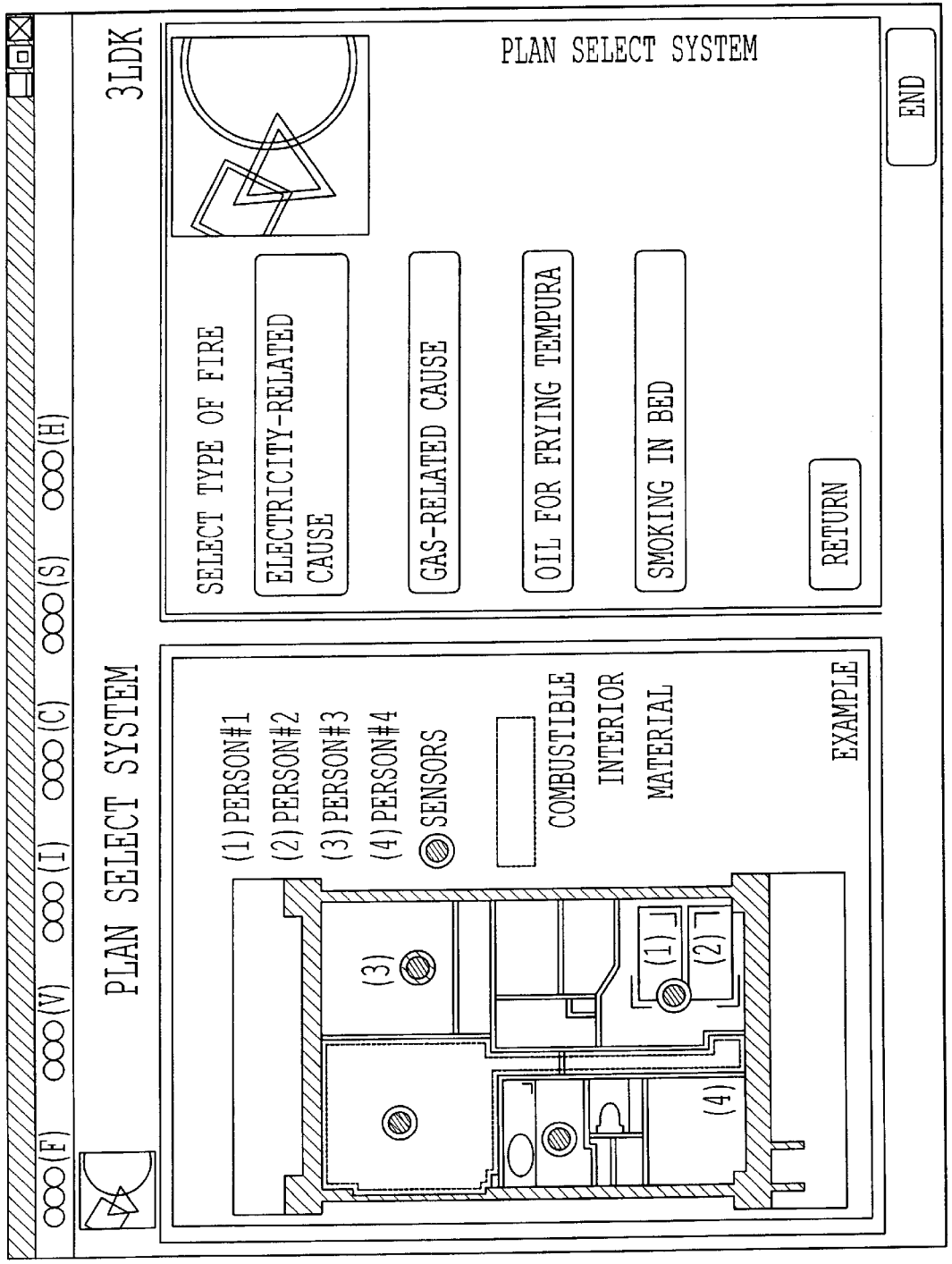
FIG. 14 is an input dialogue panel for selecting cause of fire.

In the step 204 of FIG. 2, when a plurality of causes of fire are available for simulation, the cause to be analyzed is selected for example from a look-up table by specifying that selection value 17 which corresponds to that cause. For instance, to analyze a fire caused by smoking in bed, a selection value 17 assigned to "smoking in bed" is entered. Based on the input of such selection value 17, the memory means 20 selects such a response function 21A that defines fire expansion and smoke spread caused by smoking in bed. FIG. 14 shows an example of input panel for cause of fire. When the fire safety performance for different fire occurrence points and igniting objects is desired, a location A as fire occurrence point and the spot of igniting object can be entered in the display of dwelling unit (see FIG. 8A) as a part of the step 204 of FIG. 2.

Figure 6:
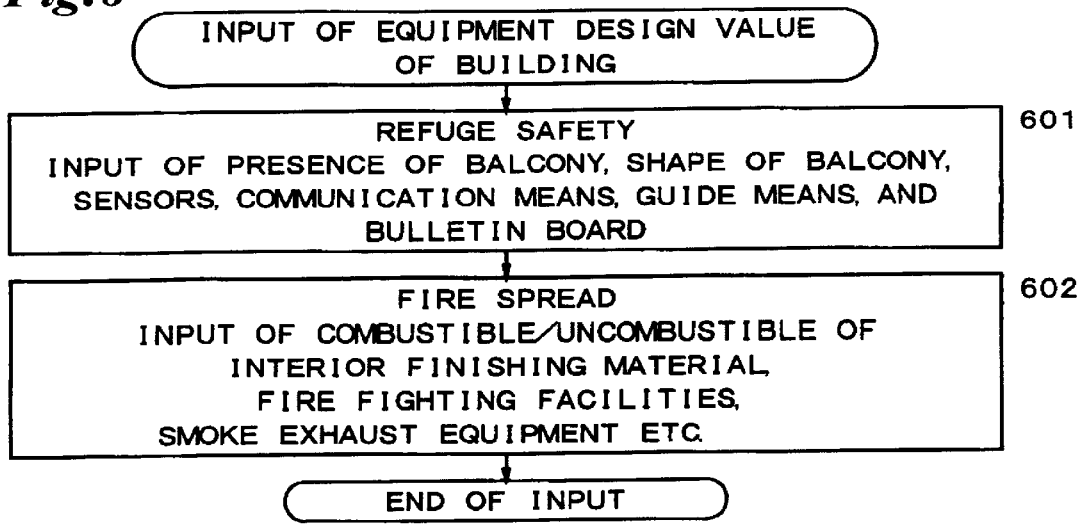
FIG. 6 is a flowchart for input process of design values of equipment installed in a building.
Figure 13:
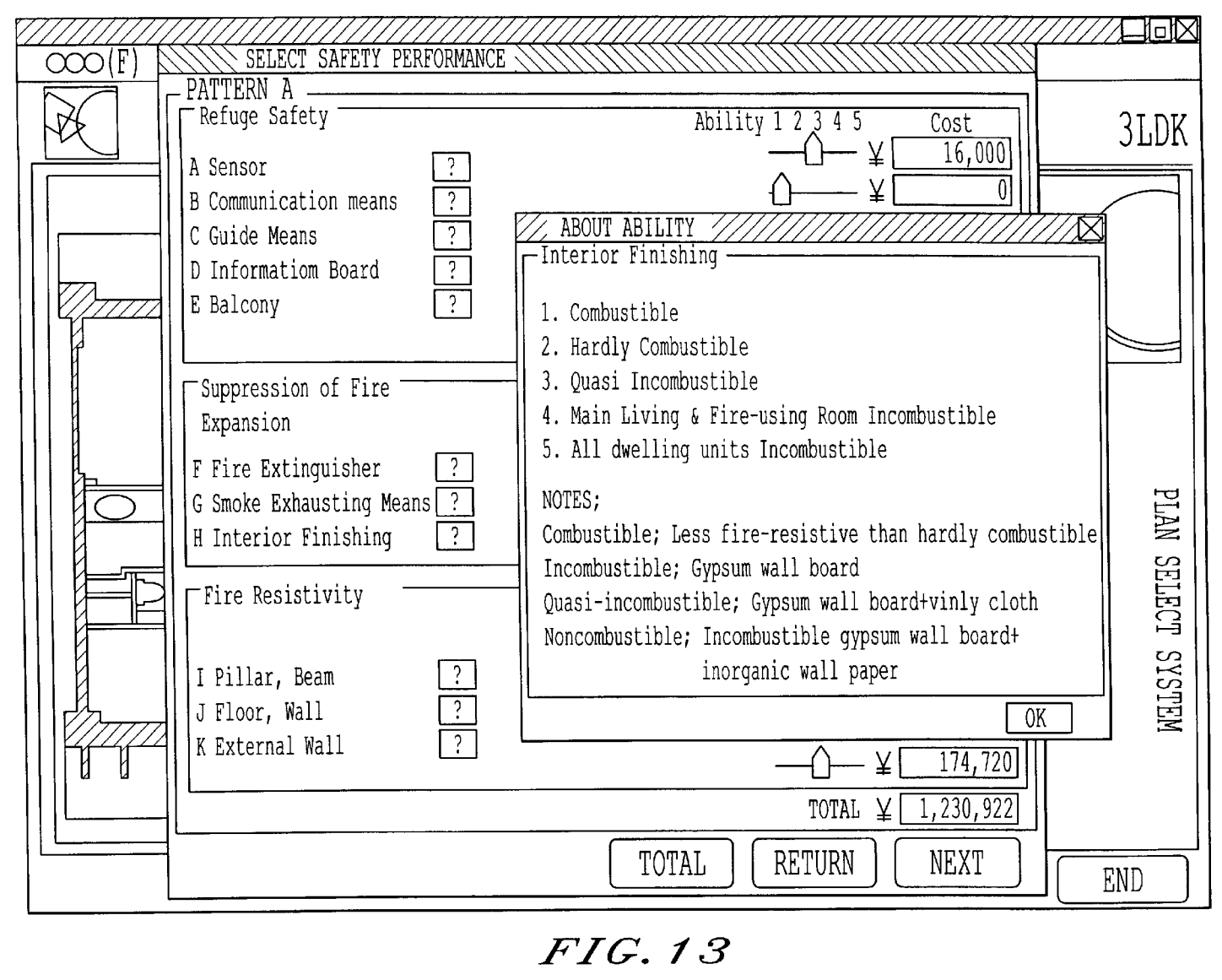

In step 205, the input means 10 enters design values 12 of equipment in the building. FIG. 6 shows an example of method for entering the equipment design value 12. In step 602, the fireproofing level (combustible or non-combustible degree) of interior finishing material, use/non-use and the location of a fire extinguisher(s), use/non-use and location of smoke exhausting equipment, and the like are entered. In step 601, use/non-use and shape of a balcony, and locations of sensors, alarm communication means, safety guide means, and bulletin boards are entered. The input of equipment design values 12 may be made easier by using plans of each dwelling unit on the display means 40. FIG. 13 shows an example of input dialogue panel for equipment design values. In FIG. 13, not only equipment design values 12, but also fireproofing capability of columns, beams, floors, inside walls, and interior and exterior walls (structure design values 11) can be entered.

When building structure design values 11 of a building, equipment design values 12 and attribute values 13 of indoor goods are entered to the computer 8 in the steps 202 through 205, the computer 8 produces three-dimensional simulation image Is1 of the building in step 206. More specifically, referring to the block diagram of FIG. 1, when the design values 11, 12 and attribute values 13 are applied to a building image producer 31 of the superposing unit 30, the building image producer 31 produces a three-dimensional simulation image Is1 of the building and interior thereof. The building image producer 31 comprises, e.g., programs stored in the computer 8, and uses software (for instance, software VEGA released by Multigen-Paradime Co.) for producing three-dimensional simulation image from CAD drawings through virtual reality (VR) techniques.

In step 207, design values 11 and 12 and attribute values 13 are applied to the response calculator 27 of the calculating unit 26, and the calculating unit 26 produces response 3 of the building to the environmental change. When the environmental change is a fire occurrence, the response function 21A for fire is read into the calculator 27 from the memory means 20. Then, the response function 21A produces response 3, which may include the fire expansion and smoke spread, while using the above-mentioned input values, i.e., design values 11, 12 and the attribute values 13. In the succeeding step 208, the response 3 thus calculated is applied to the response image producer 32 in the superposed image producing unit 30, so that the response image producer 32 produces a three-dimensional simulation image Is3 including the fire spread and smoke spread in the fire. The response image producer 32 may also comprise programs in the computer 8 and visualizes variation with time of the fire spread and smoke spread in the form of simulation image. To this end, the response image producer 32 may use software for three-dimensional simulation techniques, techniques for visualizing flames and smoke, and VR technology.

Figure 18:
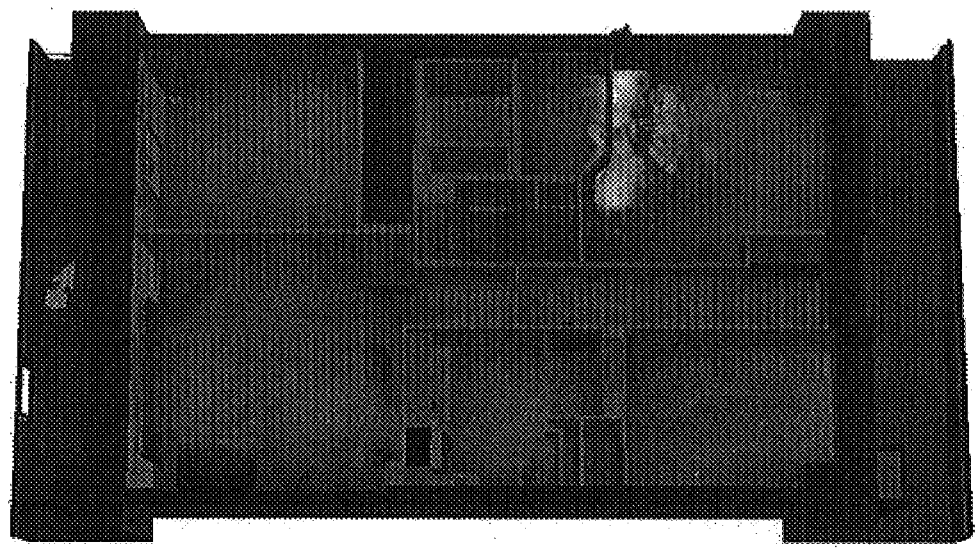

In step 209, both the three-dimensional simulation image Is1 of the building and the three-dimensional simulation image Is3 of the response 3 are applied to the image superposing means 35 in the superposed-image producing unit 30, and a superposed simulation image Is is generated as a superposition of the two images. The superposed simulation image Is thus produced is depicted on the display means 40 in the step 210. FIGS. 16 through 18 show examples of the superposed simulation image Is. Those figures are from viewing points enabling bird's eye views of all the rooms of the dwelling unit and phenomena occurring therein that change with time. FIGS. 16, 17 and 18 are simulations for the moments 17.6 seconds, 51.2 seconds and 150.5 seconds after fire occurrence, respectively. As can be seen from those figures, the superposed simulation images Is enable visual observation of changes with time of fire expansion and smoke spread, by the using design values 11 and 12 of building structure and equipment together with attribute values 13 of indoor goods.

Figure 7:
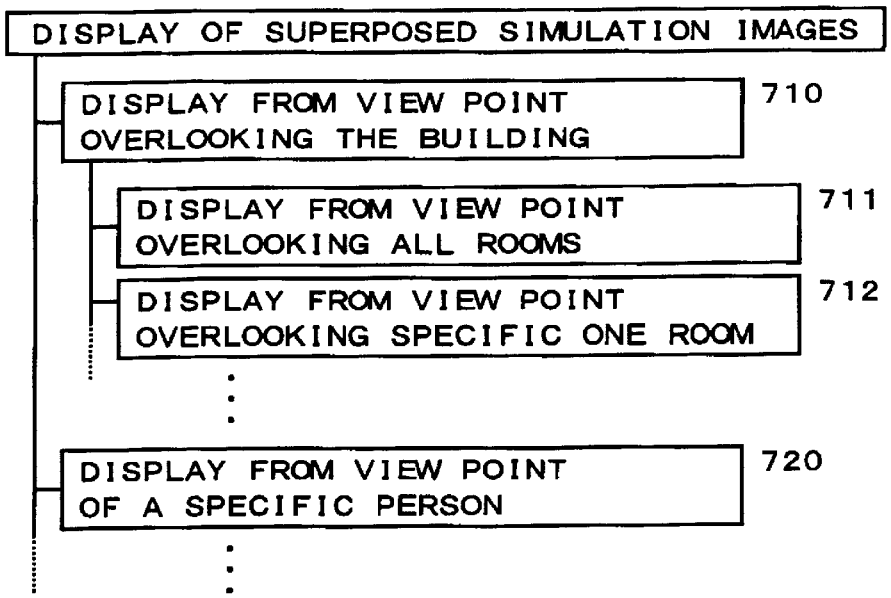
FIG. 7 is a chart of showing different viewing points for producing displays of the superposed simulation image.
Figure 19:
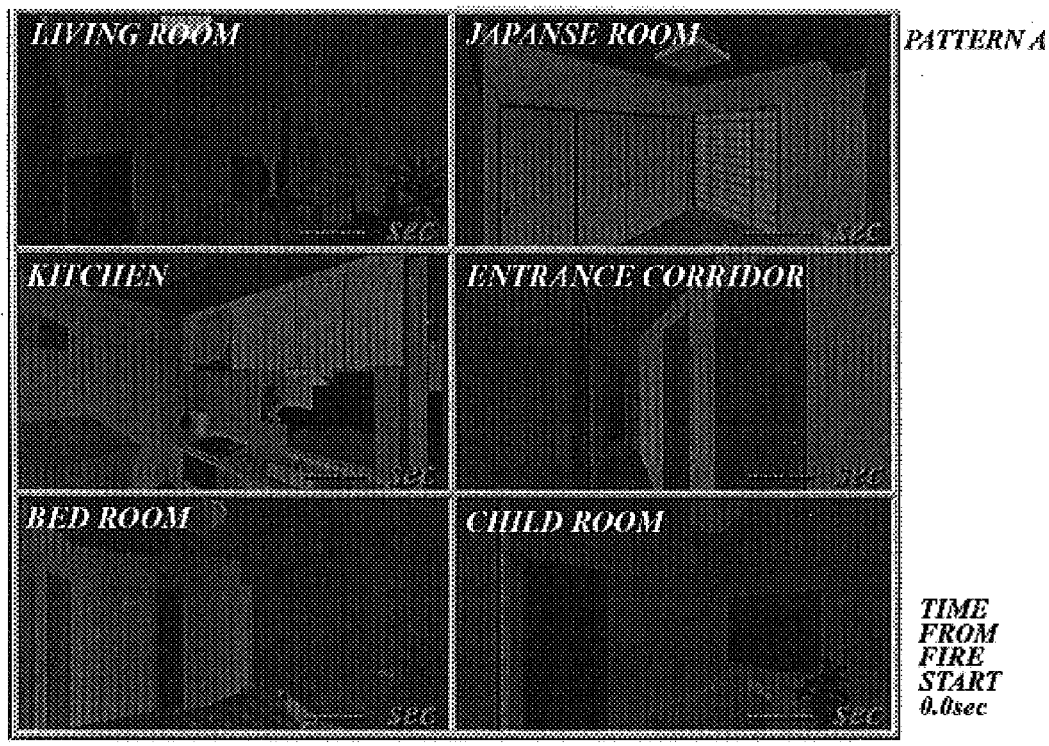
FIG. 19, FIG. 20 and FIG. 21 are black and white photographs depicting parallel displays each having six images taken from different viewing points and showing dynamic smoke spread, said six images of the three figures being simulated for the moment 0.0 second, 40.5 seconds and 101.0 seconds after fire occurrence, respectively.
Figure 20:
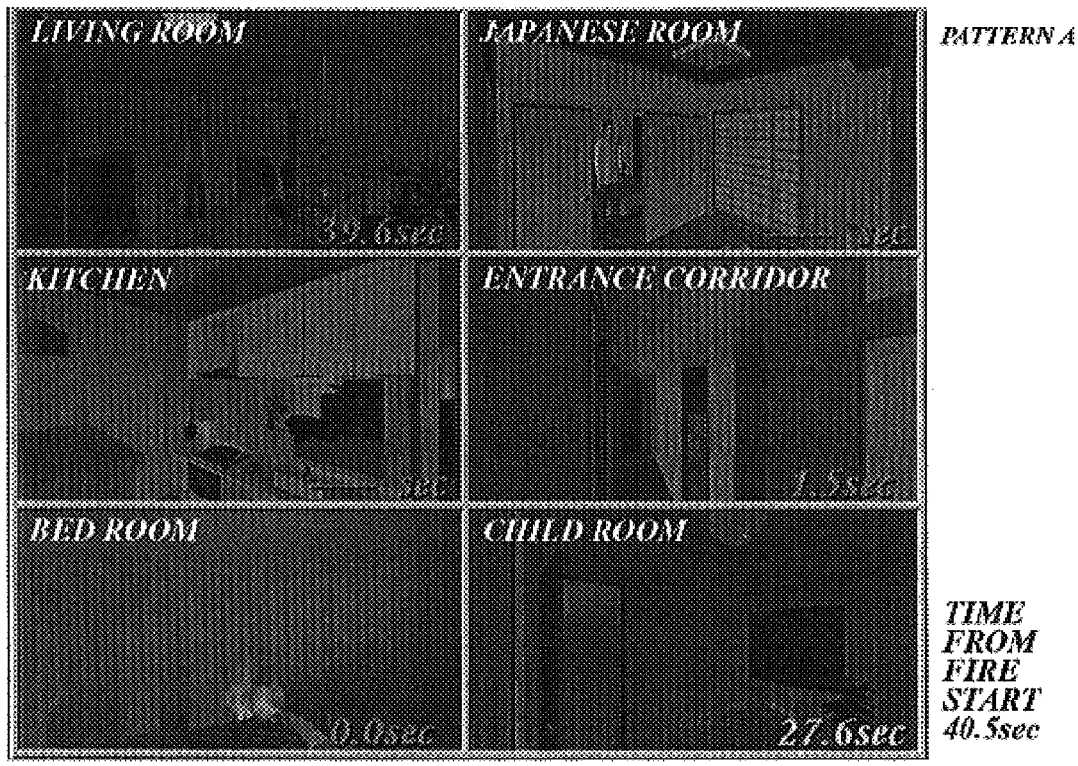
Figure 21:
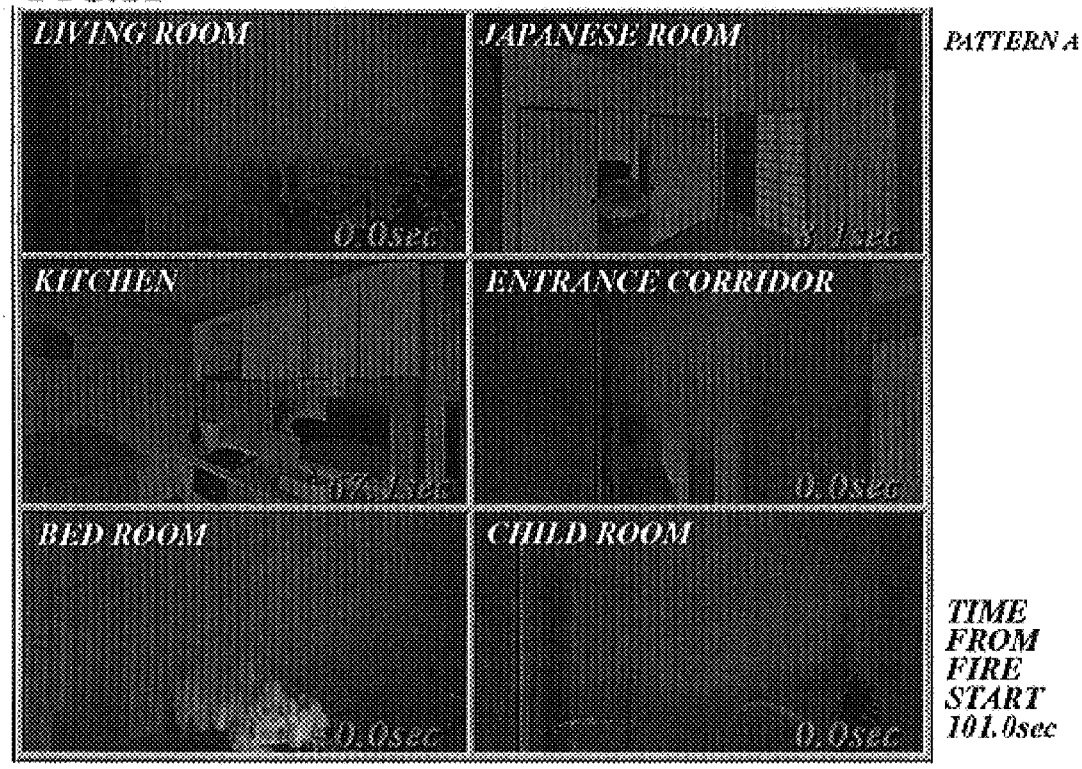

With the superposed simulation image Is by the method of the invention, it is possible to switch the viewing points rather freely in the above-mentioned visual observation of changes with time of fire expansion and smoke spread. FIG. 7 shows an example of the method of selecting the viewing point(s) (method of displaying) of the superposed simulation image Is. To visualize the response of the building, a viewing point of step 710 of FIG. 7 may be selected, while to visualize the response of a specific person, a viewing point of step 720 of the figure may be selected. For instance, if one of the steps under the step 710, for instance, step 711, is chosen, one can get simulation images Is of a plurality of rooms as shown in FIGS. 16 through 18. In this case, each image is taken from a viewing point rendering a bird's eye view overlooking all rooms in one building section. It is also possible to produce a similar superposed simulation image Is as seen from a viewing point fixed to one specific room, for instance by selecting step 712 of FIG. 7. FIGS. 19 through 21 show three pictures, each picture having six different superposed simulation images Is as seen from six different viewing points fixed on rooms and corridor(s). The six simulation images Is in each picture of FIGS. 19 through 21 are for the same moment and are disposed side by side (in parallel). The three pictures of FIGS. 19 through 21 illustrate change with time of phenomena in the rooms and corridor.

By displaying the six superposed simulation images Is from different viewing points in parallel as shown in FIGS. 19 through 21, it becomes easier to compare the heights of fire flames and the descending rates of smoke in individual rooms and corridors. Further, by showing additionally the accumulated amount of smoke or smoke height from the floor in the simulation images Is of individual rooms and corridors, the refuge safety levels of the individual rooms and corridors can be compared more easily. In each simulation image Is of FIGS. 19 through 21, refuge marginal time is additionally displayed, which refuge marginal time is calculated on the basis of a period from fire occurrence until the moment when descending smoke reaches a predetermined height (for instance, a height of 1.8 m, necessary for safe refuge) from the floor level. In FIG. 20 (40.5 seconds after fire occurrence), the refuge marginal time is 0.0 seconds for the bedroom where the fire broke out (left side bottom image), and the refuge marginal time in FIG. 21 (101.0 seconds after fire occurrence) is 0.0 seconds for most of the rooms. Further, if a joystick (not shown) is used in the display means 40 of FIG. 1, the viewing point for the superposed simulation image Is may be moved by changing the input to the joystick. Thereby, the change with time of the fire expansion and smoke spread may be observed while moving viewing points in the above-mentioned manner.

After observation of the fire expansion and smoke spread, whether to finish the analysis of the design values of equipment or not is elected in the step 211. When continuation of the analysis is elected, the analysis returns to the step 205 in which the design values 12 of equipment are renewed, and new superposed simulation images Is for the renewed design values are produced and displayed. Thereby, superposed simulation images Is for different equipment design values can be visualized simply by switching such design values in the step 205, and the difference of fire safety level due to equipment design values 12 is evaluated in an easily understandable manner. In the next step 212, whether to continue the analysis for another cause of fire or not is elected. When continuation is elected, it returns to the step 204 so that the cause of fire is switched to another value 17 to produce new superposed simulation image Is for the renewed design values.

Further, to observe the variation of fire safety performance caused by change in arrangement of furniture or other indoor goods, election for such observation is made at the step 213 of FIG. 2. Then, the analysis returns to the step 203, and the input to the calculating unit 26 is switched to attribute values 13 of indoor goods, such as furniture arrangement and storage density, and new superposed simulation images Is for such attribute values 13 are calculated and displayed. Thus, by switching the attribute values 13 for different indoor goods arrangement or the like, e.g., different ways of using a room, the superposed simulation images Is are changed accordingly. Thus, the influence of indoor goods arrangement or attribute values 13 on fire safety performance can be easily compared and evaluated. Furthermore, to observe the variation of fire safety performance caused by change in floor layout (plan design) of a dwelling unit, election for such observation is made at the step 214. The analysis returns from the step 214 to the step 202 for connecting the building structure design values 11 to the calculating unit 26. Then, as the contents of the structure design values 11 are switched, the superposed simulation display Is for the switched contents of the structure design value 11 are produced and displayed. Thereby, the difference in fire safety performance due to change of structure design values 11 is visualized. For instance, in a condominium building where room layout (plan design) of a dwelling unit is open for free design, assistance can be provided to purchasers in selection of proper room layout.

It is noted here that design data for two or more buildings, such as structural design values 11, equipment design values 12, indoor goods attribute values 13, and causes of fire, may be entered to the calculating unit 26 and superposed-image producing unit 30 of FIG. 1. Then, superposed simulation images Is of the two or more buildings may be displayed in parallel. Thus, comparison of fire safety performance for different structures, in-house equipment and indoor goods can be further facilitated.

Figure 12:
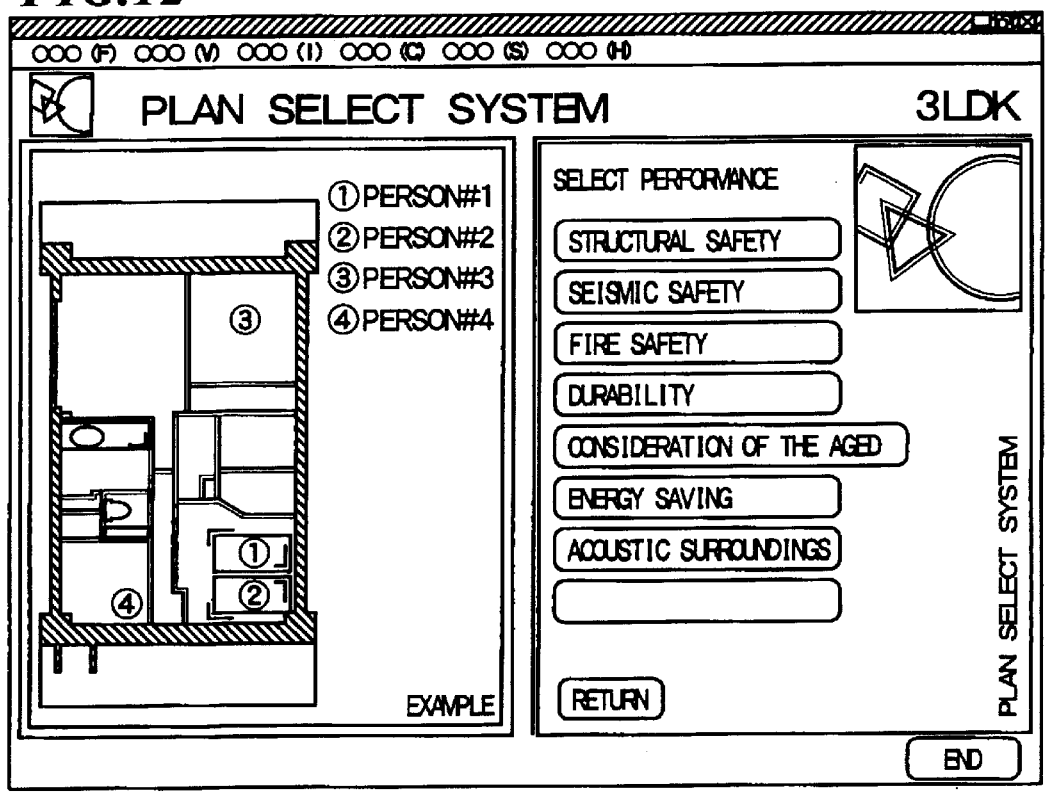
FIG. 12 is an input dialogue panel for selecting type of building performance to be analyzed.

With the present invention, in addition to fire response function 21A, response functions 21 B–21 D for various other kinds of environmental changes can be worked out and stored in the memory means 20. For instance, symbols 21B, 21C, and 21D of FIG. 1 represent response functions for earthquake, strong wind, and heavy rain, respectively. The environmental changes to be dealt with by the invention are extensive, including earthquakes, strong winds, heavy rains, hotness, coldness, air pollution, noises, upstairs living sounds, brightness, and the like. When a response function 21A is stored in the storage device 20 for the change of environment, such as earthquake, strong wind, heavy rain, coldness, hotness, air pollution, noise, life sound of upstairs, brightness, and the like, the response of the building to each kind of environmental change is visualized for analysis in the form of superposed simulation images Is on a display, depending on structure design values 11, equipment design values 12, and indoor goods attribute values 13. The kind of environment change to be analyzed is selected, for instance, at the step 204 in the flowchart of FIG. 2. FIG. 12 shows an input dialogue panel for selecting the type of safety performance for a building to be analyzed.

Upstairs living sound may be included in the building performance to be analyzed by the method of the invention. To this end, it is preferable to add a speaker unit (not shown) in the display means 40 of FIG. 1. The output of such speaker unit is a kind of simulated upstairs living sound (for instance, footstep sound) to be produced along with the displaying of the three-dimensional simulation image Is on display means 40. Such sound produced by the speaker unit depends on the building structure and equipment therein and the like. To drive the speaker unit, an upstairs living sound function with variables representing the structure of, and equipment and indoor goods in a building is defined and stored in the memory means 20. The acoustic output of the speaker unit is determined, for instance by the superposed-image producing unit 30, through substitution of the structure design value 11, equipment design value 12, indoor goods attribute values 13 in the upstairs living sound function.

Thus, the object of the invention, namely, to provide a method and an apparatus for analyzing building performance in response to environmental change based on knowledge of the structure and equipment and furniture and indoor goods in the building is fulfilled.

Embodiments

In the foregoing, the method for analyzing the response of building to an environmental change depending upon structure, equipment and indoor goods has been described. With a building of proper structure and equipment, however, certain performance such as safety of resident life may vary depending on other factors. For instance, a building, which is safe for a couple in the age group of thirties without any physical handicap, may not be safe for a family that include a baby who can not escape by oneself and/or an old person who needs physical aid. Therefore, to ensure fire safety covering safety of residents, it has been recognized that a building should designed while considering factors intrinsic to human being.

Figure 3A:
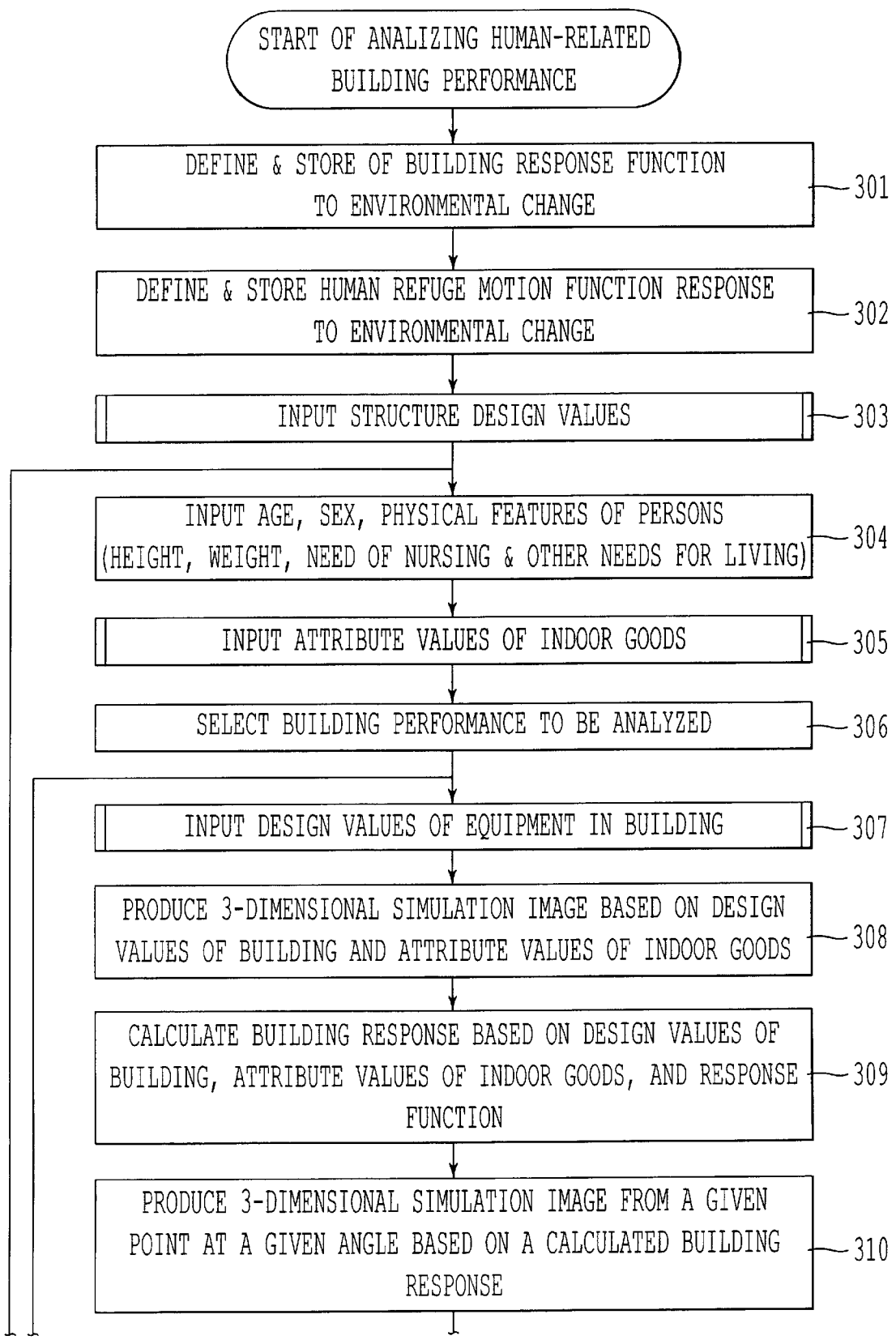
FIG. 3 is a flowchart showing the process of analyzing refuge motion of persons in the method of the present invention.
Figure 3B:
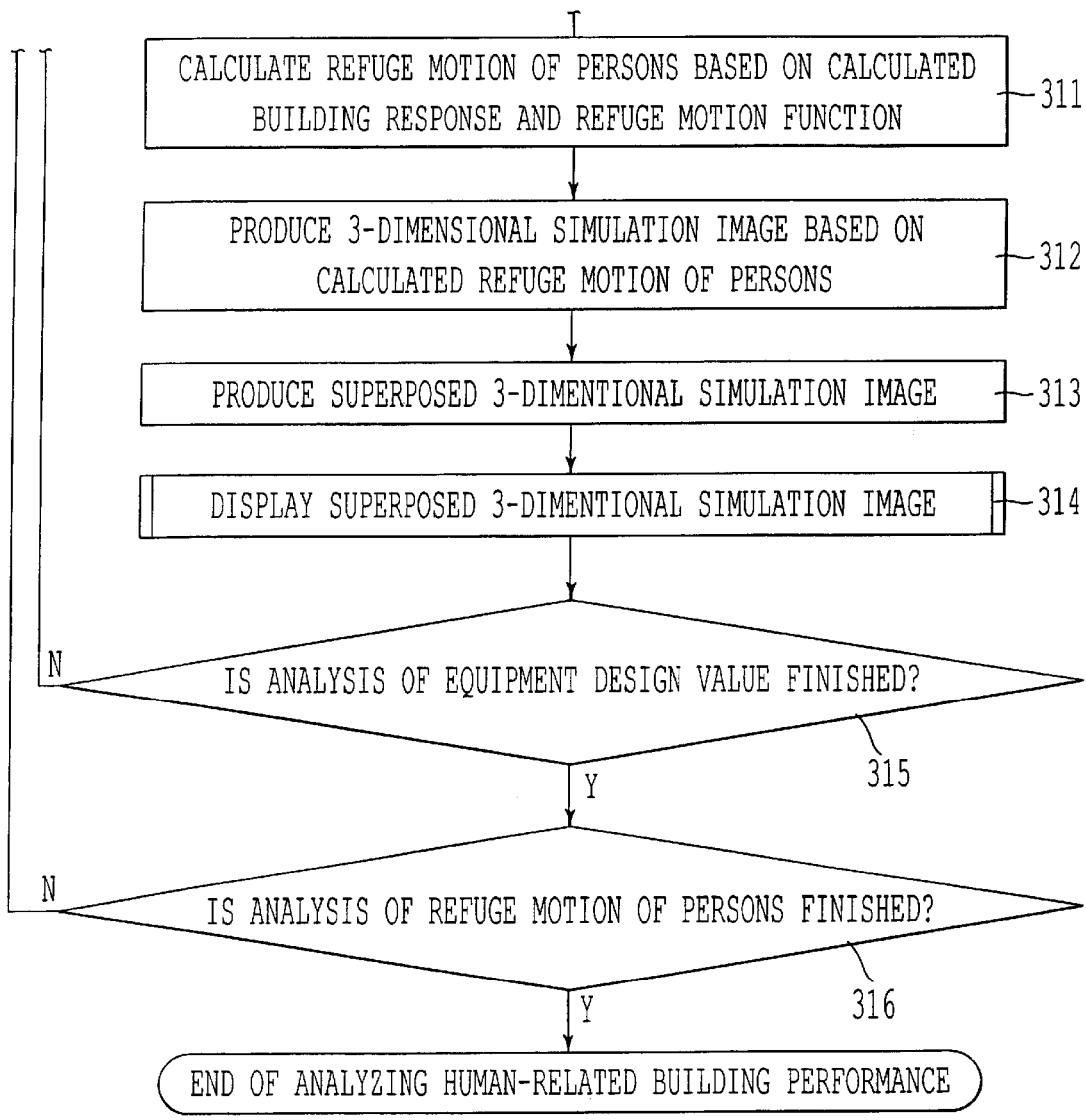

FIG. 3 is an exemplary flowchart of a method of the invention enabling analysis of refuge motion of persons in response to an environmental change. Referring to FIG. 3, to analyze refuge motion of persons, at first, a building response function 21A for giving a response 3 of the building to an environmental change is defined in step 301, and then another building response function for giving refuge motion of persons in response to the response 3 of the building (to be referred to as "refuge motion function", herein-after) 25A (25B, 25C, and 25D being equivalent elements) is defined in step 302 and stored in the memory means 20 (see FIG. 1).

The refuge motion function 25A has variables representing building response 3 and time, so as to render refuge motion with elapse of time in response to an environmental change 3. When the environmental change is an occurrence of fire, the above-mentioned refuge motion function 25A for persons can be made in the form of such fire refuge motion function 25A that renders motion of persons while using variables representing fire expansion and smoke spread. The details of the fire refuge motion function 25A and its variables can be determined based on such statistical data which are obtained through analyses and investigations on motions of actual fire victims in the past. In FIG. 1, symbols 25B, 25C, and 25D represent refuge motion functions for earthquake, strong wind, and heavy rain, respectively.

Figure 11:
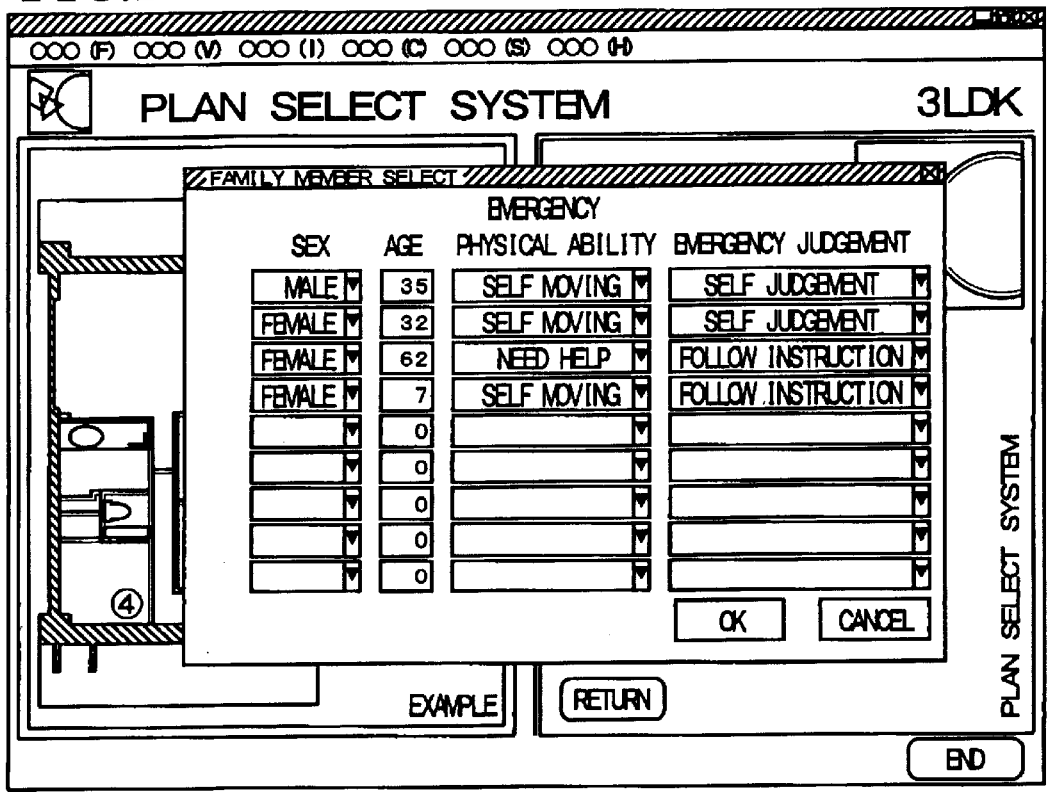
FIG. 11 is an input dialogue panel for selecting age, sex (or gender) and physical features of individual person.

Preferably, variables of refuge motion function 25A include personal attributes 15 such as age, sex, and/or physical features of a person, and the refuge motion function 25A renders refuge motion of persons based on the above variables and the calculated response 3 of the building. The personal attributes 15 includes basic data such as height and weight; physical ability (capability to act) affecting refuge motion such as disability and need of nursing; and mental ability for making judgement in refuge motion (e.g., being able to make one's own judgement like healthy adults, or relying on other's advice, like minors or bedridden old persons). In the flowchart of FIG. 3, the personal attributes 15, such as age, sex, and/or physical features, are entered in the step 304. FIG. 11 shows an input dialogue panel for entering family data, for instance number of persons, attributes 15 of individual persons including age, sex, physical feature, and the like.

An example of the refuge motion function 25A renders a refuge time T based on the building inside size L and walking speed v. The walking speed v of a person becomes slow when smoke descends, because the descending smoke tends to cause the person to assume low posture, which in turn tends to slow down his walking speed, and it varies depending on age and sex. Further, the time necessary for preparing refuge motion varies depending on age and physical features. Therefore, the refuge time T of a person can be expressed by a function of the calculated response 3 of the building concerned, and personal attributes 15 such as age, sex and/or physical features. Further, the variables of the refuge motion function 25A may include assignment to family members, time necessary for rescuing and nursing of infants and the aged, and time necessary for fire fighting and communication. Further, in case of a building having a large number of persons therein like dining rooms, the variables of the refuge motion function 25A may preferably include population density depending on the size of the area and number of persons thereat.

Referring to FIG. 3, the input operations of structure design values 11, indoor goods attribute values 13, selection value 17 and equipment design values 12 in steps 303, 305, 306 and 307 of FIG. 3 are similar to those in the steps 202, 203, 204 and 205 in FIG. 2, respectively. The step 308 for production of three-dimensional simulation image Is1 of a building, and steps 309 and 310 for calculation of response and production of three-dimensional image Is3 of FIG. 3 are similar to the description mentioned in accordance with FIG. 2.

In the step 311 of FIG. 3, the calculated building response 3 to the environmental change and the personal attributes 15, such as age, sex and/or physical feature, are applied to the refuge motion calculator 28 in the calculation unit 26. In the same step 311, the refuge motion 5 of persons is calculated by the calculator 28, based on the calculated building response 3, personal attributes 15 and refuge motion function 25. The calculated refuge motion 5 can be dealt with as refuge motion to escape from fire expansion and smoke spread in the fire of this embodiment. In the step 312, the calculated refuge motion 5 is produced by a refuge-motion image calculator 33 in a superposed-image producing unit 30, and the refuge-motion image producer 33 produces a three-dimensional simulation image Is5 which illustrates refuge motion of persons at the fire. The refuge-motion image producer 33 uses, for instance, a program installed in the computer 8, which program uses a conventional means for controlling the motion of persons in the three-dimensional simulation image with suitable commands (for instance, Software DI-GUY or People Shop manufactured by Boston Dynamic Co.).

In step 313 of FIG. 3, a three-dimensional simulation image Is1 of the building, a three-dimensional simulation image Is3 of the building response 3, and a three-dimensional simulation image Is5 of the refuge motion 5 of persons are applied to the image superposing means 35, which superposes the three images to produce a superposed three-dimensional simulation image Is. The step 314 is to send the superposed simulation image Is to the display means 40 for displaying thereon.

FIGS. 8A–8C show an example of the superposed simulation image Is having the three-dimensional simulation image Is5 of refuge motion 5 overlaid thereon. The superposed simulation image Is of FIG. 8A is a plan view of the image is projected on a plane. Three views of FIGS. 8A–8C depict change with time of fire. More specifically, FIG. 8A shows the superposed simulation image Is at fire outbreak, and FIGS. 8B and 8C show the same image Is except that the fire flame has expanded gradually wider and the smoke has also spread gradually wider with elapse of time. In addition to the fire and smoke, the three-dimensional simulation images Is of FIGS. 8A–8C also show the refuge motion 5 of persons, depending on various conditions including the design values 11, 12 of structure and equipment of the building, attribute values 13 of indoor goods, and the environmental change. Further, the refuge motion 5 of FIGS. 8A–8C include effect of attributes 15 of persons such as their age, sex, and/or physical features, and hence, it facilitates evaluation of fire safety performance of the building considering factors intrinsic to the residents. As shown in step 720 in FIG. 7, it is possible to produce the superposed simulation image Is as seen from viewing points of a specific person. In addition, as shown in FIG. 7, it is possible to produce the superposed simulation image Is as seen from a viewpoint overlooking the building (710), from a viewpoint overlooking all rooms (711), and from a viewpoint overlooking one specific room (712). Therefore, it becomes possible to provide easy-to-understand display of building fire safety, which displays being from the viewing points of the residents. In this case, the refuge motion of the specific person may be manually controlled by modifying the input to a joystick, while controlling the refuge motion of other persons with the fire refuge motion function 25A.

With the flowchart in FIG. 3, it is possible to observe the refuge motion 5 of persons while changing the levels of structure design values 11, equipment design values 12, and attribute values 13 of indoor goods (see step 315 in FIG. 3, steps 211–214 in FIG. 2). Thus, difference in refuge motion 5 due to difference in structure, equipment, and/or indoor goods can be visualized and evaluated. Further, with the flowchart of FIG. 3, the fire refuge motion 5 can be evaluated while changing the personal attributes 15, and hence it becomes possible to evaluate the change of fire safety level of a building with the degree of aging of its residents. To do this observation of the change of safety level with resident aging, operation returns from the step 316 of FIG. 3 to step 304, and after modifying the attribute 15 including the age, the production of the superposed simulation image Is is run again. In short, with the method of the invention, the fire safety performance of a building can be evaluated not only for the present level but also for future levels.

Referring to the block diagram of FIG. 1, the input means 10 and the display means 40 may be connected to the computer 8 through a communication line such as that of an internet system, so that the building performance analysis method of the invention can be used remotely. Referring to input dialogue panel of FIG. 9 for election of input/performance/display, elections necessary for remote use of the method will be made. More specifically, use of a remote display means 40 connected to the computer 8 through communication line will be elected. Similarly, entering of the parameters, such as structure design values 11, equipment design values 12 and indoor good attribute values 13 and the like, from the input means 10 to the computer 8 through communication line will be elected. Consequently, the superposed simulation images Is calculated by the method of the invention are transmitted from the computer 8 to the remote display means 40 through communication lines, depending on input conditions and the instruction on "selection of image display" on the panel, so that the superposed simulation images Is are shown on the remote display means 40.

Figure 9:
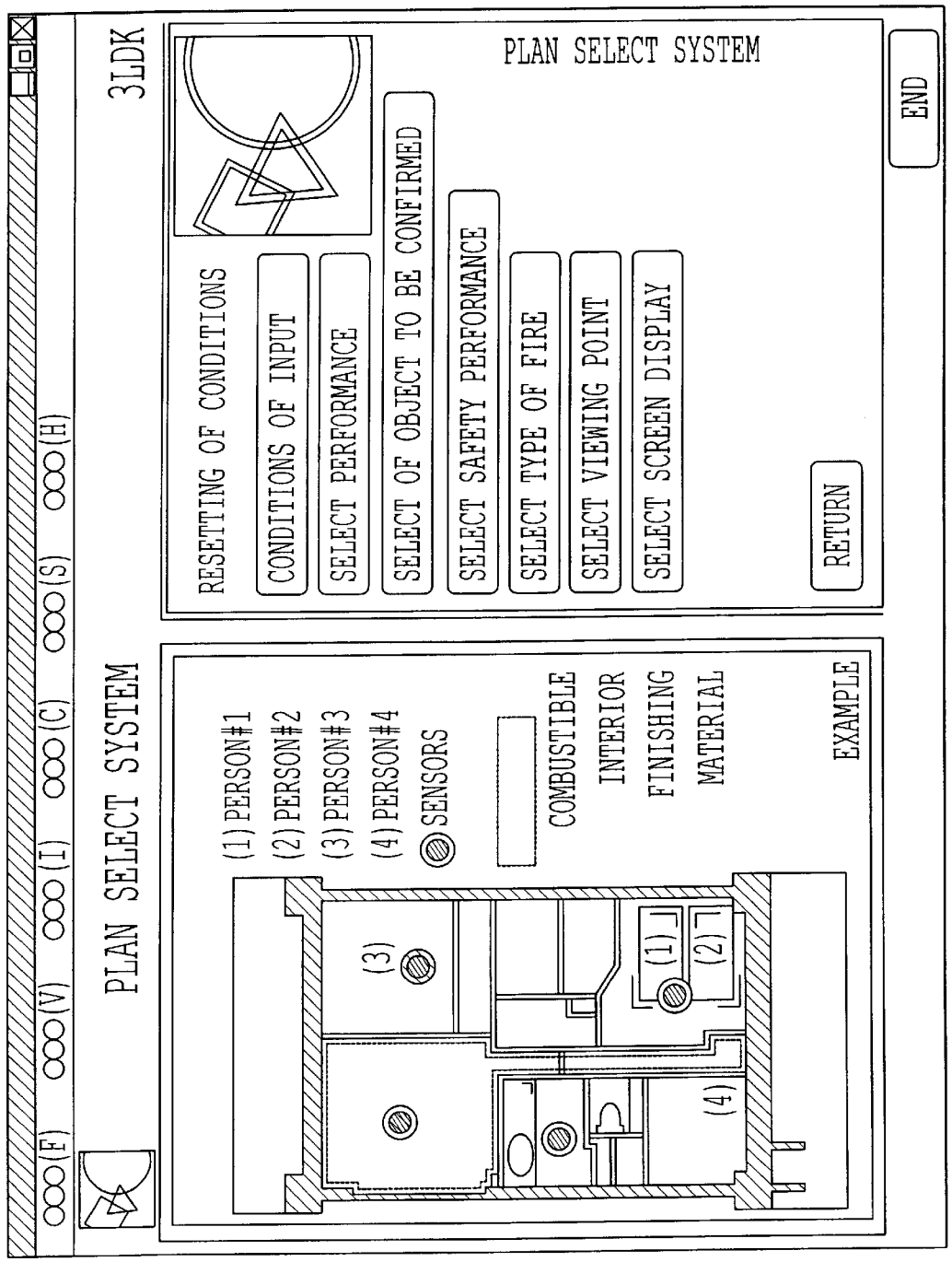
FIG. 9 is an input dialogue panel for selecting type of performance analysis.
Figure 15:
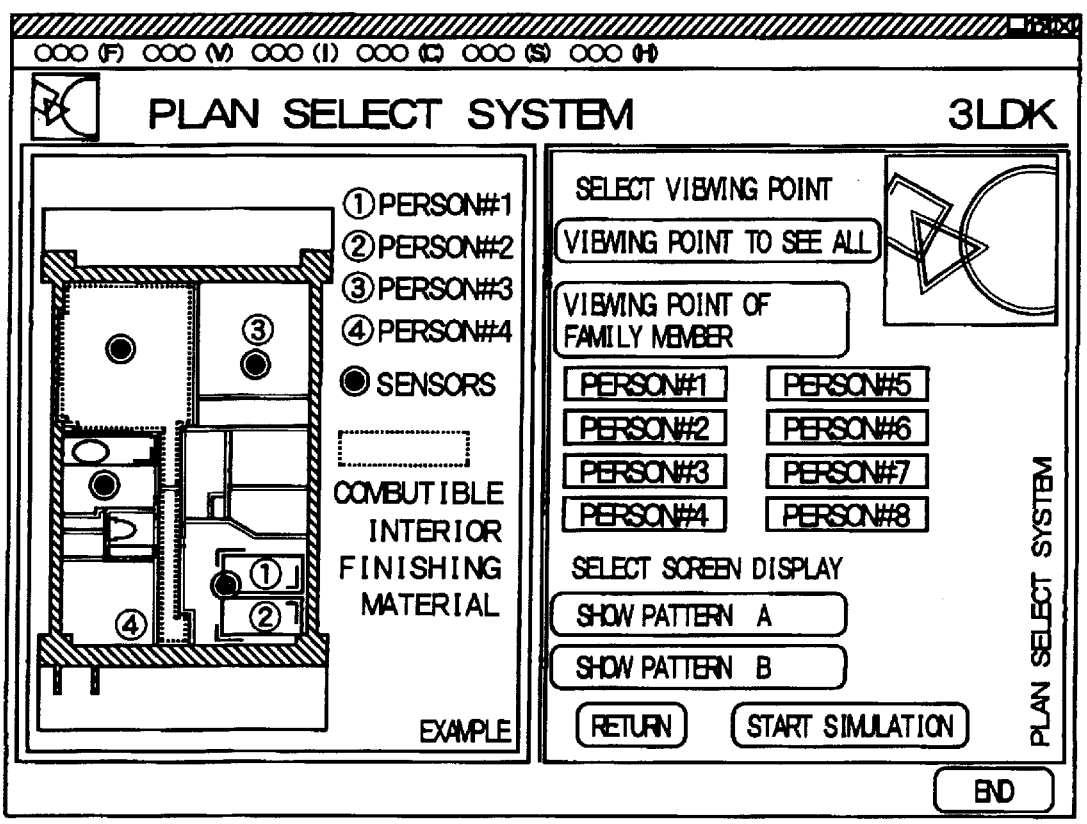
FIG. 15 is an input dialogue panel for selecting viewing point of a superposed simulation image.

Referring to the input prompt panel of FIG. 9, if the "CONDITIONS OF INPUT" button is clicked, input panels of FIG. 10 and FIG. 11 are shown, and in response to clicking of "PERFORMANCE SELECTION", input panel of FIG. 12 is shown. Clicking of "SELECT SAFETY PERFORMANCE" corresponds to the input panel of FIG. 13, clicking of "SELECT FIRE TYPE" corresponds to the input panel of FIG. 14, and clicking of "SELECT VIEWING POINT" corresponds to the input panel of FIG. 15, respectively.

Specific Effects of the Invention

As described in the foregoing, with the method and apparatus for analyzing building performance of the invention, a mathematical function of building structure (as a variable) for rendering response of the building to an environmental change is stored in a memory means, and response of the building and inside thereof is calculated by substituting design values of the building structure (the variable) into said function, and then the response of the building are visualized as three-dimensional images for visual analysis. Therefore, the present invention has the following specific effects.

(a) Building performance in response to an environmental change can be analyzed by using design values, such as those of structure and equipment in the building. Hence, owners and users can easily evaluate the building performance.

(b) Building response to an environmental change is analyzed by considering, along with other factors, attributes of indoor goods, such as arrangement or disorderliness of furniture and other indoor goods, which attributes have not been considered in the past. Thus, it is made possible to evaluate such building performance that reflects the way of daily life.

(c) The building performance is visualized in an easily understandable manner by using images seen from the viewpoint of residents in daily life. Hence, the visualization of building performance contributes to smoother formation of consensus between residents (owners) and contractors (designers, builders) than before with respect to the building performance.

(d) Comparison of different building performances due to use of different building structures and equipment can be easily made, by simply substituting different design values of such structures and equipment in the response function. Hence, such comparison contributes to improvement in the design of room layout (floor planning) and equipment.

(e) Image of refuge motion of persons is superposed onto that of building response to an environmental change, and it is made possible to evaluate the building performance from the standpoint of refuge motion of persons.

(f) Refuge motion of persons is simulated based on their attributes such as age, sex and physical ability for motion, and hence it is made possible to evaluate the building performance while reflecting such attributes of residents onto the performance.

(g) Refuge motion of persons is simulated and displayed while changing family makeup and members' age, and hence it is made possible to evaluate the building performance of not only in the present but also in the future with modified family makeup and members' age.

(h) Evaluation of the building performance in the future is made possible, and the possibility in evaluating building performance in the future will contributes to design of building structure and equipment while considering the balance between initial cost and running cost.

(i) Users can easily evaluate the building performance, and hence clarification of the division of responsibility between designers and users can be promoted.

What is claimed is:

1. A method for visual learning of refuge motion from a building in response to environmental change, comprising:

storing (1) a building response function that defines a response of the building and an inside thereof to a specific environmental change in terms of a structure of the building, and (2) a refuge motion function that defines refuge motion of individual persons in the building in terms of both attributes of the individual persons and the response of the building;

computing the building response by substituting design values of the structure of the building into the building response function;

computing the refuge motion of individual persons by substituting the attributes and the computed building response into the refuge motion function;

producing a superposed display of (1) a three-dimensional simulation image of the structure according to the design values, (2) a three-dimensional simulation image of the computed building response, and (3) a three-dimensional simulation image of the computed refuge motion of the individual persons, so as to indicate whether a safety level of said computed refuge motion is sufficient based on a relationship among the three images in the superposed display, the three images being produced under specific viewing conditions including a position and angle of viewing; and when the safety level of said computed refuge motion is indicated as insufficient, seeking a safer refuge motion by a manual modification of the computed refuge motion through a change of at least one of said position and said angle of viewing through use of a joystick and by getting an indication of a safety level of said modification through a superposition of the modification with the structure simulation.

2. The method of claim 1, wherein said building has equipment installed thereon, and said building response function defines the building response to a specific environmental change in terms of at least one of said structure of the building and design values of the equipment.

3. The method of claim 1, wherein said building has indoor goods disposed therein, and said building response function defines the building response to a specific environmental change in terms at least one of said structure of the building and attributes of the indoor goods.

4. The method of claim 1, wherein said attributes of the individual persons in the refuge motion function include an age, sex, and physical features of each individual person, and said three-dimensional simulation image of the refuge motion is produced for each individual person.

5. The method of claim 3, wherein said attributes include need of physical and/or mental aid of certain individual persons causing delays in refuge motion.

6. The method of claim 3, wherein said attributes include delays in refuge motion of specific individual persons due to nursing other persons in need.

7. The method of claim 1, wherein the three-dimensional simulation images are produced as seen from a selected viewing-point suitable for clearly rendering the building structure as designed, as well as the building response and the refuge motion, in response to the specific environmental change.

8. The method of claim 1, wherein the specific environmental change is an occurrence of a fire.

9. The method of claim 8, wherein a plurality of superposed displays taken at different locations in the building are produced side by side on a screen so as to show the spreading extent of the fire.

10. The method of claim 8, wherein fire causes, including at least one of electricity, gas, cooking, and cigarettes, are designated, and the building response function is defined for each of the at least one designated fire causes.

11. The method of claim 1, wherein the specific environmental change is an occurrence of an earthquake.

12. An apparatus for visual learning of refuge motion from a building responsive to an environmental change, comprising:

- a memory for storing a building response function that defines a building response of the building and an inside thereof to a specific environmental change in terms of a structure of the building, and a refuge motion function that defines refuge motion of individual persons in the building in terms of both attributes of the individual persons and said building response of the building;
- an input means for entering design values of the structure of the building and attributes of the individual persons;
- an operating means for computing the building response by substituting design values of the structure of the building into the building response function, and the refuge motion of individual persons by substituting the attributes and the computed building response into the refuge motion function;
- an image-producing means for producing a superposed display of (1) a three-dimensional simulation image of the building according to the design values, (2) a three-dimensional simulation image of the computed building response, and (3) a three-dimensional simulation image of the computed refuge motion of the individual persons;
- a display for showing the superposed display so as to indicate whether a safety level of said computed refuge motion is sufficient based on a relationship among the superposed three images in the superposed display, the three images being produced under specific viewing conditions including a position and an angle of viewing; and
- joystick means adapted to modify said computed refuge motion through a manual change in the position and the angle of the viewing in the superposed display of three-dimensional images.

13. The apparatus of claim 12, wherein said building has equipment installed thereon, and said building response function defines the building response in terms of at least one of said structure of the building and design values of the equipment.

14. The apparatus of claim 12, wherein said building has indoor goods disposed therein, and said building response function defines the building response in terms of at least one of said structure of the building and attributes of the indoor goods.

15. The apparatus of claim 12, wherein said attributes of the individual persons in the refuge motion function include an age, sex, and physical features of each individual person, and said three-dimensional simulation image of the refuge motion is produced for each individual person.

16. The apparatus of claim 15, wherein said attributes include need of physical and/or mental aid of certain individual persons causing delays in refuge motion.

17. The apparatus of claim 16, wherein said attributes include delays in refuge motion of specific individual persons due to nursing other persons in need.

18. The apparatus of claim 12, wherein the specific environmental change is an occurrence of a fire.

19. The apparatus of claim 18, wherein fire causes, including at least one of electricity, gas, cooking, and cigarettes, are designated in the input means, and the building response function is defined for each of the at least one designated fire causes.

20. The apparatus of claim 12, wherein the specific environmental change is an occurrence of an earthquake.

* * * * *

UNITED STATES PATENT AND TRADEMARK OFFICE
CERTIFICATE OF CORRECTION

PATENT NO. : 6,701,281 B2
DATED : March 2, 2004
INVENTOR(S) : Satoh et al.

It is certified that error appears in the above-identified patent and that said Letters Patent is hereby corrected as shown below:

Title page,
Item [30], Foreign Application Priority Data, should read:
-- [30] Foreign Application Priority Data
  Jul. 14, 2000  (JP) ............................ 2000-214786 --

Signed and Sealed this

Fourth Day of May, 2004

JON W. DUDAS
*Acting Director of the United States Patent and Trademark Office*